US008384076B2

(12) United States Patent
 Park et al.

(10) Patent No.: US 8,384,076 B2
(45) Date of Patent: Feb. 26, 2013

(54) TRANSISTORS, SEMICONDUCTOR DEVICES AND METHODS OF MANUFACTURING THE SAME

(75) Inventors: Jaechul Park, Seoul (KR); Keewon Kwon, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/453,530

(22) Filed: May 14, 2009

(65) Prior Publication Data
 US 2009/0283763 A1 Nov. 19, 2009

(30) Foreign Application Priority Data

May 15, 2008 (KR) .................. 10-2008-0045108
Sep. 30, 2008 (KR) .................. 10-2008-0096027

(51) Int. Cl.
 *H01L 29/12* (2006.01)
 *H01L 27/12* (2006.01)
 *H01L 21/00* (2006.01)
(52) U.S. Cl. ............... 257/43; 257/347; 257/E29.01; 438/149
(58) Field of Classification Search .............. 257/347, 257/43, 59, E29.01, 213, 72; 438/149, 151, 438/162
 See application file for complete search history.

(56) References Cited

U.S. PATENT DOCUMENTS

| 4,960,718 A | 10/1990 | Aina |
| 5,337,274 A | 8/1994 | Ohji |
| 5,656,824 A | 8/1997 | Den Boer et al. |
| 5,854,139 A | 12/1998 | Aratani et al. |
| 5,972,527 A | 10/1999 | Kaijou et al. |
| 6,107,734 A | 8/2000 | Tanaka et al. |
| 6,458,636 B1 | 10/2002 | Yi et al. |
| 6,552,387 B1 | 4/2003 | Eitan |
| 6,562,491 B1 | 5/2003 | Jeon |
| 6,563,174 B2 | 5/2003 | Kawasaki et al. |
| 6,727,522 B1 | 4/2004 | Kawasaki et al. |
| 6,727,533 B2 | 4/2004 | Matsuzaki et al. |
| 6,878,962 B1 | 4/2005 | Kawasaki et al. |

(Continued)

FOREIGN PATENT DOCUMENTS

| CN | 1348192 | 5/2002 |
| EP | 1 737 044 | 12/2006 |

(Continued)

OTHER PUBLICATIONS

The MOSFET—Introduction, MOS Field Effect Transistors, Van Zeghbroeck, Web book "Principles of Semiconductor Devices", Boulder, Dec. 2004, Chapter 7.*

(Continued)

*Primary Examiner* — Thomas L Dickey
*Assistant Examiner* — Nikolay Yushin
(74) *Attorney, Agent, or Firm* — Harness, Dickey & Pierce, P.L.C.

(57) ABSTRACT

A transistor having a self-align top gate structure and methods of manufacturing the same are provided. The transistor includes an oxide semiconductor layer having a source region, a drain region, and a channel region between the source region and the drain region. The transistor further includes a gate insulating layer and a gate electrode, which are sequentially stacked on the channel region. Semiconductor devices including at least one transistor and methods of manufacturing the same are also provided.

30 Claims, 21 Drawing Sheets

U.S. PATENT DOCUMENTS

| | | | |
|---|---|---|---|
| 6,882,012 B2 | 4/2005 | Yamazaki et al. | |
| 6,929,970 B2 | 8/2005 | Andriessen et al. | |
| 7,061,014 B2 | 6/2006 | Hosono et al. | |
| 7,067,843 B2 | 6/2006 | Carcia et al. | |
| 7,071,122 B2 | 7/2006 | Saenger et al. | |
| 7,145,174 B2 | 12/2006 | Chiang et al. | |
| 7,188,922 B2 | 3/2007 | Kubo | |
| 7,189,992 B2 | 3/2007 | Wager, III et al. | |
| 7,220,635 B2 | 5/2007 | Brask et al. | |
| 7,285,501 B2 | 10/2007 | Mardilovich et al. | |
| 7,411,209 B2 | 8/2008 | Endo et al. | |
| 7,456,468 B2 | 11/2008 | Jeon et al. | |
| 2001/0000756 A1 | 5/2001 | Batra et al. | |
| 2002/0074657 A1 | 6/2002 | Nakayama et al. | |
| 2002/0146624 A1 | 10/2002 | Goto et al. | |
| 2003/0218221 A1 | 11/2003 | Wager, III et al. | |
| 2004/0038446 A1 | 2/2004 | Takeda et al. | |
| 2004/0069990 A1 | 4/2004 | Mahajani et al. | |
| 2004/0127038 A1 | 7/2004 | Carcia et al. | |
| 2004/0155270 A1 | 8/2004 | Hoffman | |
| 2004/0180217 A1 | 9/2004 | Inoue et al. | |
| 2005/0017244 A1 | 1/2005 | Hoffman et al. | |
| 2005/0017302 A1 | 1/2005 | Hoffman | |
| 2005/0039670 A1 | 2/2005 | Hosono et al. | |
| 2005/0062134 A1 | 3/2005 | Ho et al. | |
| 2005/0167668 A1 | 8/2005 | Korenari et al. | |
| 2005/0199959 A1 | 9/2005 | Chiang et al. | |
| 2005/0199960 A1 | 9/2005 | Hoffman et al. | |
| 2005/0258474 A1 | 11/2005 | Tanaka et al. | |
| 2005/0275038 A1 | 12/2005 | Shih et al. | |
| 2006/0003485 A1 | 1/2006 | Hoffman et al. | |
| 2006/0038242 A1 | 2/2006 | Hsu et al. | |
| 2006/0068091 A1 | 3/2006 | Denda | |
| 2006/0079034 A1 | 4/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0214008 A1* | 9/2006 | Asami et al. | 235/492 |
| 2006/0220023 A1 | 10/2006 | Hoffman et al. | |
| 2006/0244107 A1 | 11/2006 | Sugihara et al. | |
| 2006/0284172 A1 | 12/2006 | Ishii | |
| 2006/0286737 A1* | 12/2006 | Levy et al. | 438/199 |
| 2006/0292777 A1 | 12/2006 | Dunbar | |
| 2007/0007538 A1 | 1/2007 | Ono et al. | |
| 2007/0023750 A1 | 2/2007 | Chiang et al. | |
| 2007/0072439 A1 | 3/2007 | Akimoto et al. | |
| 2007/0184576 A1 | 8/2007 | Chang et al. | |
| 2007/0187760 A1* | 8/2007 | Furuta et al. | 257/347 |
| 2007/0194379 A1 | 8/2007 | Hosono et al. | |
| 2007/0254399 A1 | 11/2007 | Wang et al. | |
| 2008/0067508 A1* | 3/2008 | Endo et al. | 257/43 |
| 2008/0197414 A1 | 8/2008 | Hoffman et al. | |
| 2008/0206923 A1 | 8/2008 | Kim et al. | |
| 2008/0315194 A1 | 12/2008 | Kim et al. | |
| 2008/0315200 A1 | 12/2008 | Kim et al. | |
| 2009/0211903 A1 | 8/2009 | Lee et al. | |
| 2010/0127253 A1 | 5/2010 | Inoue et al. | |

FOREIGN PATENT DOCUMENTS

| | | |
|---|---|---|
| JP | 63-265818 | 11/1988 |
| JP | 10-306367 | 11/1998 |
| JP | 2003-017749 | 1/2003 |
| JP | 2004-356196 | 12/2004 |
| JP | 2005-026465 | 1/2005 |
| JP | 2005-033172 | 2/2005 |
| JP | 2006-005116 | 1/2006 |
| JP | 2007-073312 | 3/2007 |
| JP | 2007-529119 | 10/2007 |
| KR | 10-2000-0074893 | 12/2000 |
| KR | 10-2005-0092712 | 9/2005 |
| KR | 10-2006-0114469 | 11/2006 |
| KR | 10-2007-0090182 | 9/2007 |
| KR | 10-0811997 | 3/2008 |
| WO | WO 2005/074038 A1 | 8/2005 |
| WO | WO 2005/088726 | 9/2005 |
| WO | WO 2007/119386 | 10/2007 |
| WO | WO 2007/040194 | 6/2008 |

OTHER PUBLICATIONS

Chinese Office Action mailed Oct. 25, 2010 and English translation thereof.
Office Action dated Nov. 24, 2010 for U.S. Appl. No. 11/978,581.
Office Action dated Dec. 3, 2010 for U.S. Appl. No. 12/071,097.
Chinese Office Action mailed Aug. 4, 2010 and English translation thereof.
Chinese Office Action mailed Aug. 23, 2010 and English translation thereof.
European Search Report dated Aug. 28, 2009.
European Search Report and Written Opinion dated Jun. 16, 2010.
European Search Report and Written Opinion dated Jun. 14, 2010.
Office Action mailed May 11, 2010 for co-pending U.S. Appl. No. 11/978,581.
Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Aug. 20, 2009 for co-pending U.S. Appl. No. 11/785,269.
Office Action mailed Apr. 2, 2010 for co-pending U.S. Appl. No. 12/213,327.
Office Action mailed Sep. 15, 2009 for co-pending U.S. Appl. No. 12/213,327.
Office Action mailed Nov. 16, 2009 for co-pending U.S. Appl. No. 12/213,399.
Office Action mailed May 21, 2010 for co-pending U.S. Appl. No. 11/785,269.
International Search Report dated May 21, 2008.
International Search Report dated Dec. 19, 2008.
International Search Report dated Sep. 25, 2008.
US Office Action dated Feb. 25, 2011, issued in co-pending U.S. Appl. No. 12/213,402.
Supplemental Notice of Allowance dated Dec. 27, 2010 in co-pending U.S. Appl. No. 11/785,269.
U.S. Office Action dated Oct. 6, 2011, issued in co-pending U.S. Appl. No. 11/978,581.
Office Action for Chinese Application No. 200780022377.5 dated Oct. 25, 2010 and English Translation thereof.
U.S. Office Action dated Jul. 25, 2011, issued in co-pending U.S. Appl. No. 12/213,402.
U.S. Office Action dated Jun. 27, 2011, issued in co-pending U.S. Appl. No. 12/071,097.
Notice of Allowance dated Dec. 8, 2011, issued in co-pending U.S. Appl. No. 12/213,402.
Office Action issued by the European Patent Office dated May 10, 2011 for EP Application No. 09 160 223.5-1528.
European Exam Report dated Jan. 23, 2012 issued in European Application No. 09160223.5.
European Search Report dated Jan. 23, 2012 issued in European Application No. 11183826.4.
Japanese Office Action dated Jan. 1, 2012 issued in Japanese Application No. 2009-506414.
U.S. Office Action dated Mar. 22, 2012 issued in U.S. Appl. No. 12/929,324.
U.S. Notice of Allowance dated Apr. 5, 2012 issued in U.S. Appl. No. 12/213,402.
U.S. Office Action dated Apr. 6, 2012 issued in U.S. Appl. No. 11/978,581.
U.S. Office Action dated Apr. 13, 2012 issued in U.S. Appl. No. 12/929,323.

Nomura, Kenji et al. "Room-temperature fabrication of transparent flexible thin-film transistors using amorphous oxide semiconductors," *Nature*, vol. 432 (Nov. 25, 2004): pp. 488-492.

International Search Report and Written Opinion dated Jul. 25, 2007 issued in International Application No. PCT/KR2007/001875.

US OA dated Jul. 17, 2012 issued in U.S. Appl. 12/929,324.

Carcia, P.F. et al. "Transparent ZnO thin-film transistor fabricated by rf magnetron sputtering," *Applied Physics Letters*, vol. 82, No. 7 (Feb. 17, 2003): pp. 1117-1119.

Chinese Office Action dated Aug. 23, 2012, issued in Application No. 200910140975.3 and Enlish translation thereof.

\* cited by examiner

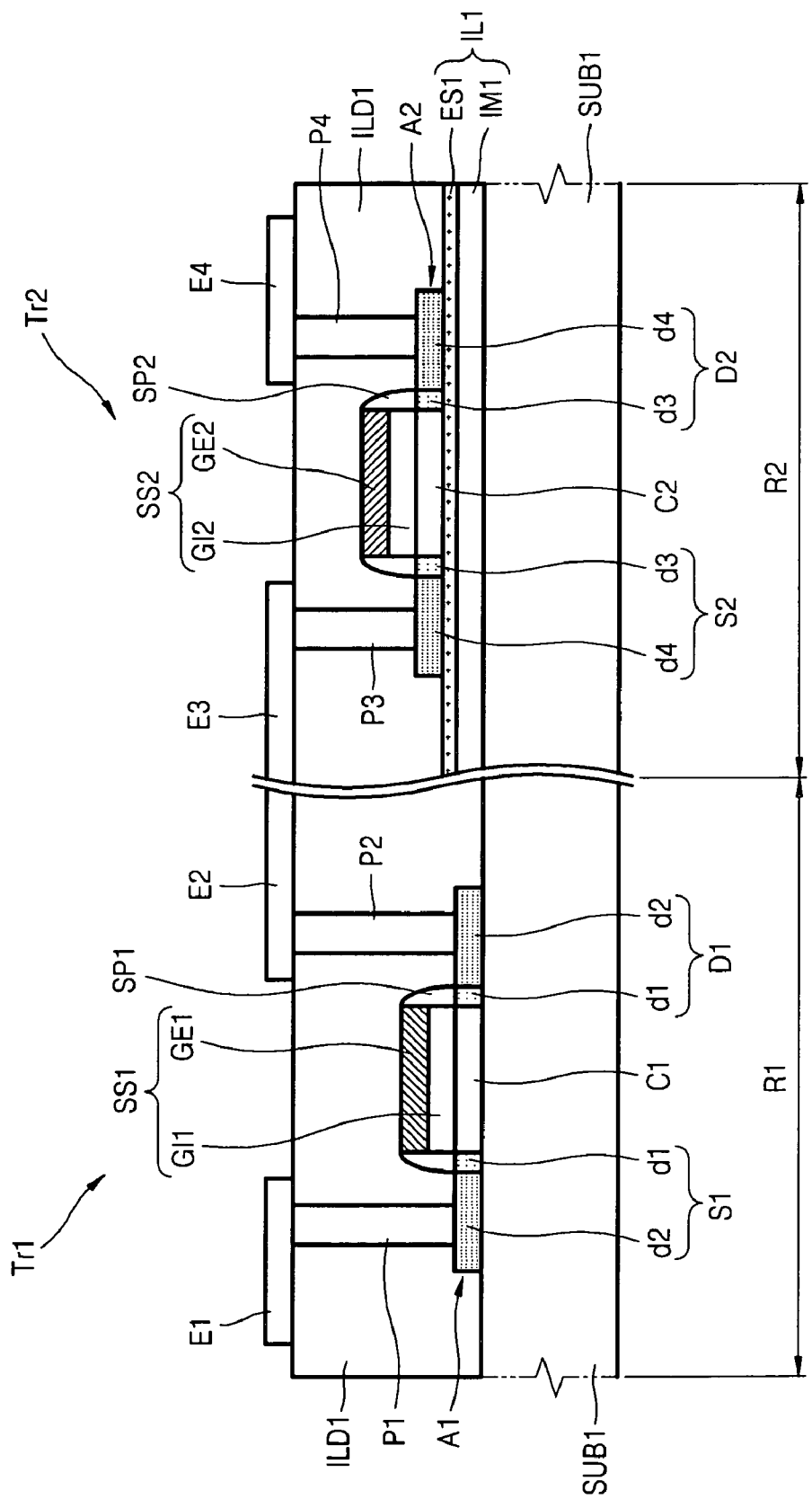

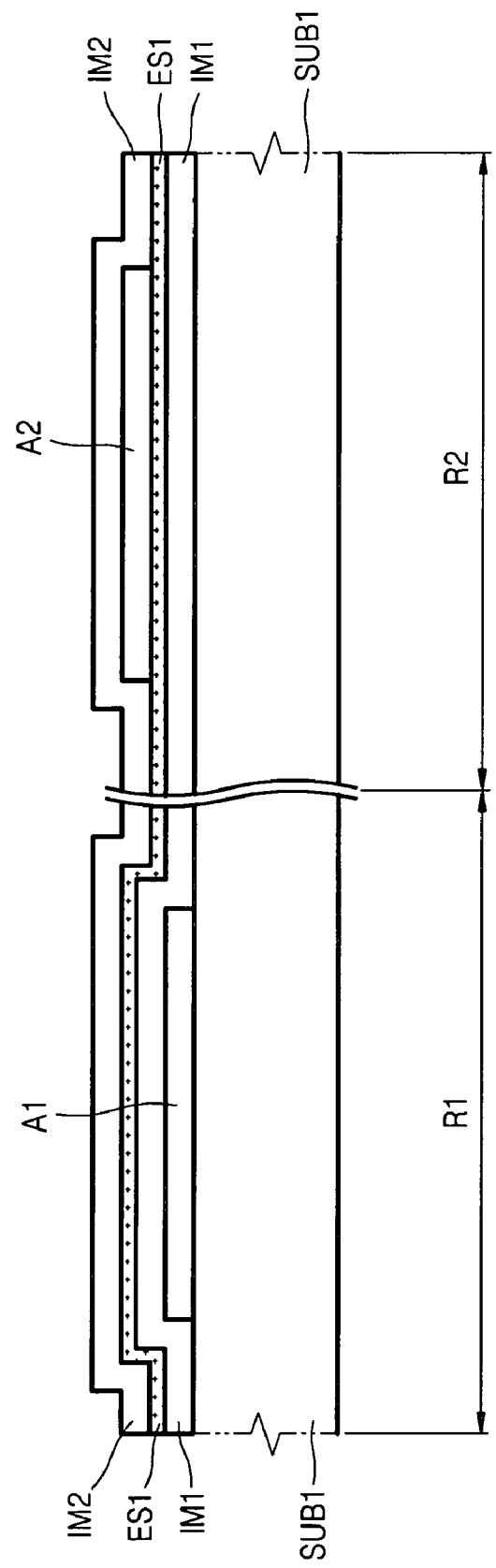

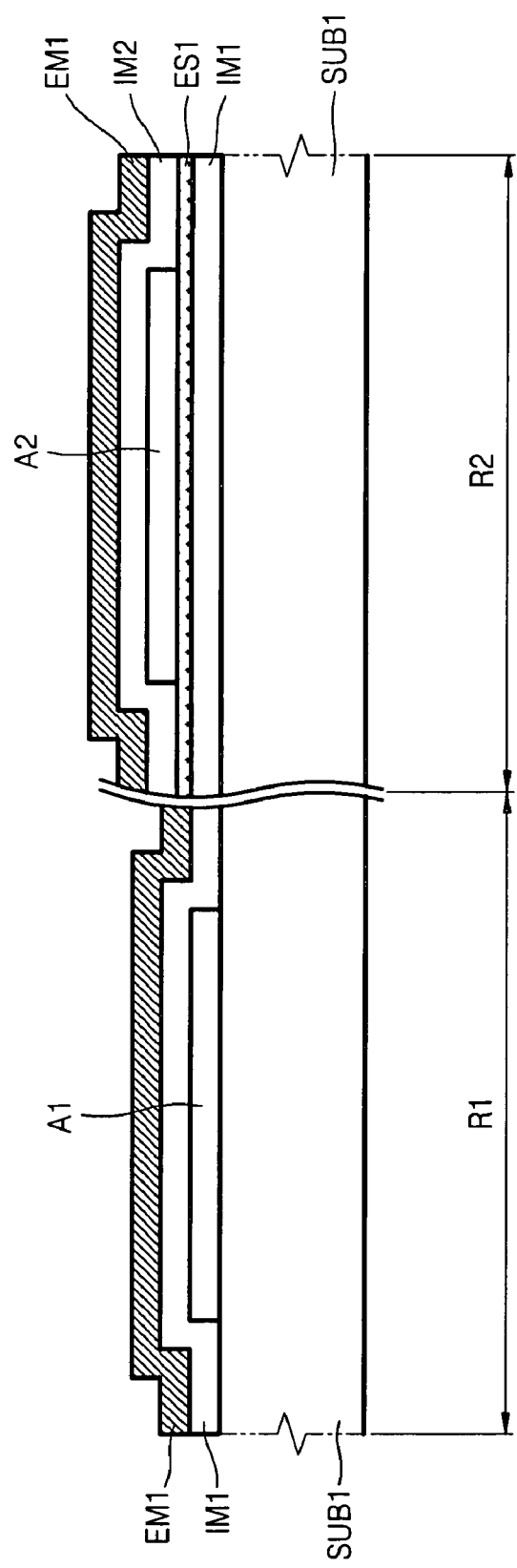

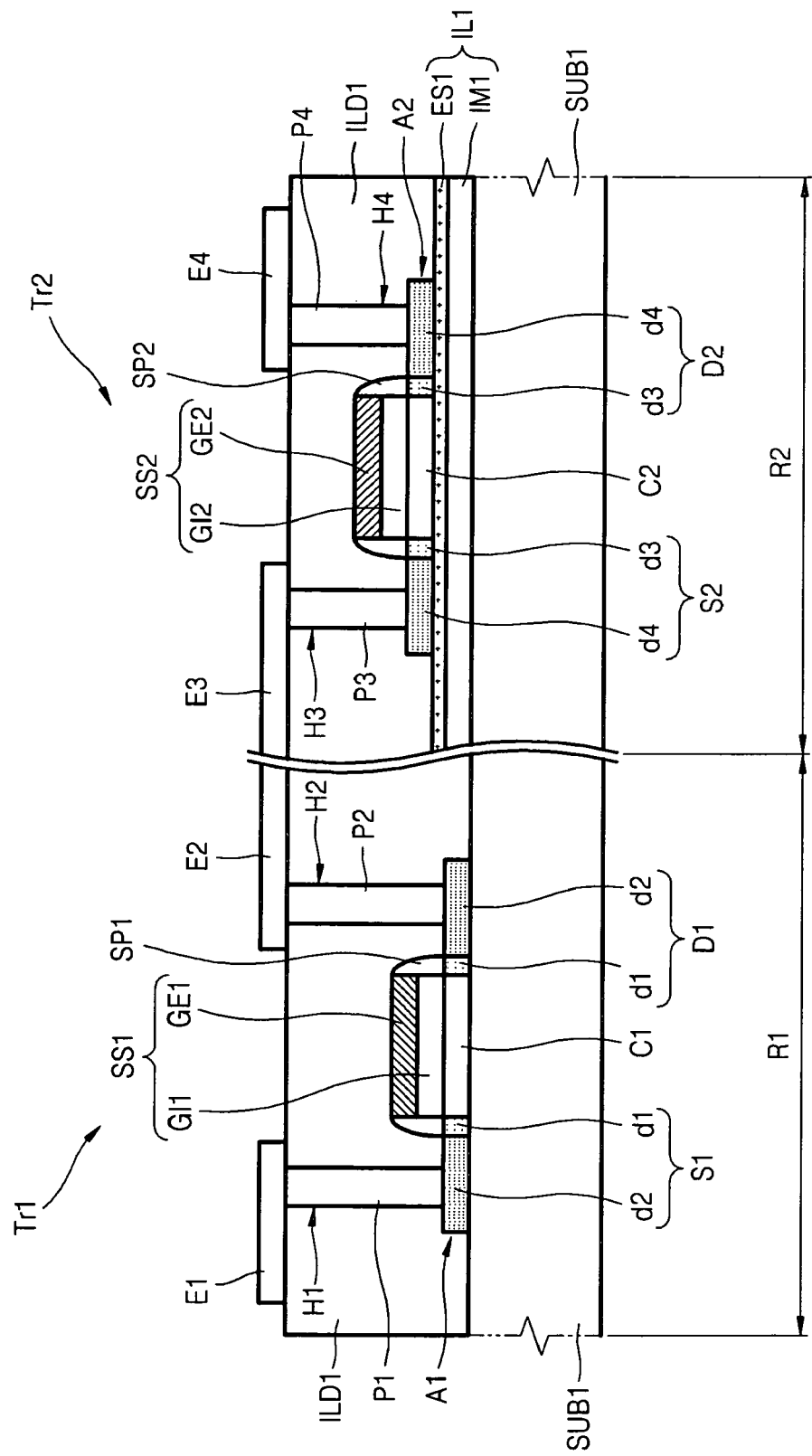

TRANSISTORS, SEMICONDUCTOR DEVICES AND METHODS OF MANUFACTURING THE SAME

CROSS-REFERENCE TO RELATED APPLICATION(S)

This non-provisional U.S. patent application claims priority under 35 U.S.C. §119 to Korean Patent Application No. 10-2008-0045108, filed on May 15, 2008, and Korean Patent Application No. 10-2008-0096027, filed on Sep. 30, 2008, in the Korean Intellectual Property Office. The entire contents of each of these applications are incorporated herein by reference.

BACKGROUND

1. Field

One or more example embodiments relate to semiconductor devices. For example, one or more example embodiments provide thin film transistors (TFTs), semiconductor devices including one or more thin film transistors (TFTs) and methods of manufacturing the same.

2. Description of the Related Art

Thin film transistors (TFTs) are used as switching devices and driving devices in flat display devices such as liquid crystal display devices (LCDs) and organic light emitting display devices (OLEDs). The performance of a TFT is affected by the material and state of a channel layer through which charge carriers travel.

Generally, a conventional or related art flat display device includes amorphous silicon TFTs or polycrystal silicon TFTs. Amorphous silicon TFTs have channel layers formed of amorphous silicon, whereas polycrystal silicon TFTs have channel layers formed-of polysilicon.

The charge mobility of an amorphous silicon TFT is about 0.5 $cm^2/Vs$, which is relatively low. Thus, it is relatively difficult to increase the operating speed of such related art flat display devices. Moreover, amorphous silicon TFTs generally have a bottom gate structure. In a bottom gate structure, portions of the source and drain overlap a portion of the gate. As a result, parasitic capacitance increases, thereby reducing the operating speed of the TFT. But, these overlapped portions are required, and thus, it is relatively difficult to scale-down devices using bottom-gate TFTs.

Crystallization, impurities injection, and activation are required to manufacture a polycrystal silicon TFT. Accordingly, the manufacturing process is more complicated and manufacturing costs are higher than an amorphous silicon TFT. In addition, because the size of crystalline particles of a polycrystal silicon layer is irregular, image quality deteriorates display device size increases. Thus, a polycrystal silicon TFT is restrictively used in smaller-sized display devices.

SUMMARY

One or more example embodiments provide thin film transistors (TFTs) including an oxide semiconductor layer as a channel layer, and semiconductor devices including at least one TFT.

One or more example embodiments include methods of manufacturing TFTs and semiconductor devices.

At least one example embodiment provides a semiconductor device including at least one transistor (e.g., a thin film transistor (TFT)). The transistor includes an oxide semiconductor layer formed on a substrate. The oxide semiconductor layer has a source region, a drain region, and a channel region between the source region and the drain region. The channel region, the source region and the drain region are formed of an oxide semiconductor. The transistor further includes a stack structure including a gate insulating layer and a gate electrode stacked sequentially on the channel region.

At least one other example embodiment provides a transistor. The transistor includes an oxide semiconductor layer formed on a substrate. The transistor further includes a stack structure. The oxide semiconductor layer has a source region, a drain region, and a channel region between the source region and the drain region. The stack structure includes a gate insulating layer and a gate electrode, which are stacked on the channel region.

According to at least some example embodiments, the source region and the drain region may be plasma-treated. Each of the source region and the drain region may include two regions having different conductivities. A first of the two regions may have a smaller conductivity than a second of the two regions. The first of the two regions having the smaller conductivity may be formed adjacent to the channel region.

According to at least some example embodiments, the semiconductor device may further include insulating spacers formed at each side wall of the stack structure. The first of the two regions having the smaller conductivity may be disposed below each of the insulating spacers. The semiconductor device may further include a bottom gate electrode disposed below the channel region.

According to at least some example embodiments, the oxide semiconductor layer may have a multilayer structure including at least two layers. For example, the multilayer structure may be double-layer structure in which a first layer and a second layer are stacked sequentially. Alternatively, the multilayer structure may include at least three layers. The first layer may include ZnO-based oxide. The second layer may include at least one of indium-zinc-oxide (IZO), indium-tin-oxide (ITO), aluminum-zinc-oxide (AZO), gallium-zinc-oxide (GZO), a mixture including at least one of the foregoing, or an oxide having greater electrical conductivity than that of the first layer.

At least one example embodiment provides a semiconductor device including at least two transistors (e.g., TFTs). A first transistor includes a first oxide semiconductor layer formed on a substrate. The first oxide semiconductor layer has a first source region, a first drain region, and a first channel region between the first source region and the first drain region. The first channel region, the first source region and the first drain region may be formed of a first oxide semiconductor. The transistor further includes a first stack structure including a first gate insulating layer and a first gate electrode stacked sequentially on the first channel region.

A second of the at least two transistors may include a second oxide semiconductor layer having a second source region, a second drain region, and a second channel region between the second source region and the second drain region. The second channel region, the second source region and the second drain region may be formed of a second oxide semiconductor. The second transistor may further include a second stack structure including a second gate insulating layer and a second gate electrode stacked sequentially on the second channel region.

According to at least some example embodiments, the second source region and the second drain region may be plasma-treated. The second oxide semiconductor may be of the same or a different type as the first oxide semiconductor. When the first and second oxide semiconductor layers are different types, an insulating layer may be disposed between the substrate and the second transistor, and the first and second oxide semiconductor layers may be disposed on different layers.

According to at least some example embodiments, the semiconductor device may further include a bottom gate electrode disposed below at least one of the first channel region and the second channel region. At least one of the first oxide semiconductor layer and the second oxide semiconductor layer may have a multilayer structure including at least two layers. The multilayer structure may be, for example, a double-layer structure in which a first layer and a second layer are stacked sequentially. Alternatively, the multilayer structure may include at least three layers. The first layer may include ZnO-based oxide. The second layer may include at least one of IZO, ITO, AZO, GZO, a mixture including at least one of the foregoing, or an oxide having greater electrical conductivity than that of the first layer.

According to at least some example embodiments, each of the second source region and the second drain region may include two regions having different conductivities. A first of the two regions may have a smaller conductivity than a second of the two regions. The first region may be adjacent to the second channel region.

According to at least some example embodiments, the semiconductor device may further include first insulating spacers formed at each side wall of the first stack structure. The first of the two regions of the first source and drain regions having the smaller conductivity may be disposed below each of the first insulating spacers. Second insulating spacers may be formed at each side wall of the second stack structure. The first of the two regions of the source and drain regions having the smaller conductivity may be disposed below each of the second insulating spacers.

At least one example embodiment provides a method of manufacturing a semiconductor device including a transistor. According to at least this example embodiment, an oxide semiconductor layer is formed on a region of a substrate. A stack structure including a gate insulating layer and a gate electrode is formed on the oxide semiconductor layer. The gate insulating layer and the gate electrode are stacked sequentially. A source region and a drain region are formed in portions of the oxide semiconductor layer at each side of the stack structure. The source region, the drain region and the channel region are formed of an oxide semiconductor.

At least one example embodiment provides a method of manufacturing a semiconductor device including at least two transistors. According to at least this example embodiment, a first and a second transistor are formed. With respect to the first transistor, a first oxide semiconductor layer is formed on a first region of a substrate. A first stack structure including a first gate insulating layer and a first gate electrode is formed on the first oxide semiconductor layer. The first gate insulating layer and the first gate electrode are stacked. A first source region and a first drain region are formed in portions of the first oxide semiconductor layer, which are disposed on both sides of the first stack structure.

With respect to the second transistor, a second oxide semiconductor layer is formed on a second region of the substrate. A second stack structure including a second gate insulating layer and a second gate electrode is formed on the second oxide semiconductor layer. The second insulating layer and the second gate electrode are stacked. A second source region and a second drain region are formed in portions of the second oxide semiconductor layer, which are disposed on both sides of the second stack structure.

At least one example embodiment provides a method of manufacturing a transistor. According to at least this example embodiment, an oxide semiconductor layer is formed on a region of a substrate, and a stack structure including a gate insulating layer and a gate electrode is formed on the oxide semiconductor layer. The gate insulating layer and the gate electrode are stacked. A source region and a drain region are formed in portions of the oxide semiconductor layer, which are disposed on both sides of the stack structure.

According to at least some example embodiments, the forming of the oxide semiconductor layer may further include plasma-treating the oxide semiconductor layer. The gate insulating layer may be formed by sequentially forming a lower layer and an upper layer, and plasma-treating the oxide semiconductor layer covered by the lower layer between the forming of the lower layer and the upper layer. The plasma may be, for example, a gas plasma including oxygen. When the lower layer and the upper layer are formed using deposition gas including hydrogen, a hydrogen concentration of deposition gate used to form the lower layer may be lower than the case of upper layer.

According to at least some example embodiments, the source region and the drain region may be formed by plasma-treating portions of the oxide semiconductor layer at each side of the stack structure to form conductive regions in the portions of the oxide semiconductor layer.

After performing the plasma-treating, insulating spacers may be formed at each side wall of the stack structure, and portions of the oxide semiconductor layer at each side of the stack structure and the insulating spacers may be plasma treated again. A bottom gate electrode may be formed on the substrate, and a lower insulating layer covering the bottom gate electrode may be formed. The oxide semiconductor layer may be formed on the lower insulating layer disposed on the bottom gate electrode. The oxide semiconductor layer may have a multilayer structure including at least two layers. For example, the multilayer structure may be double-layer structure in which a first layer and a second layer are stacked sequentially. Alternatively, the multilayer structure may include at least three layers. The first layer may include ZnO-based oxide. The second layer may include at least one of IZO, ITO, AZO, GZO, a mixture including at least one of the foregoing, or an oxide having greater electrical conductivity than that of the first layer.

At least one example embodiment provides a method of manufacturing a semiconductor device including at least two transistors. According to at least this example embodiment, a first oxide semiconductor layer is formed on a first region of a substrate. A first stack structure including a first gate insulating layer and a first gate electrode is formed on the first oxide semiconductor layer. The first gate insulating layer and the first gate electrode are stacked sequentially. A first source region and a first drain region are formed in portions of the first oxide semiconductor layer at each side of the first stack structure. The first source region, first drain region, and first channel region are formed of a first oxide semiconductor.

A second of the at least two transistors may be formed on a second region of the substrate. According to at least this example embodiment, a second oxide semiconductor layer is formed on the second region of the substrate and a second stack structure including a second gate insulating layer and a second gate electrode is formed on the second oxide semiconductor layer. The second gate insulating layer and the second gate electrode are stacked sequentially. A second source region and a drain region are formed in portions of the second oxide semiconductor layer at each side of the second stack structure. The second source region, second drain region, and second channel region are formed of a second oxide semiconductor.

According to at least some example embodiments, the first stack structure may be formed as follows. A first gate insulating material layer covering the first oxide semiconductor layer is formed on the substrate. A first gate electrode material layer is formed on the first gate insulating material layer, and the first gate electrode material layer and the first gate insulating material layer are patterned.

When the first and second oxide semiconductor layers are different types, an etch-stop layer may be formed on the first gate insulating material layer, the second oxide semiconductor layer may be formed on the etch-stop layer of the second region of the substrate, and a second gate insulating material layer covering the second oxide semiconductor layer may be formed on the etch-stop layer. The second gate insulating material layer and the etch-stop layer may be sequentially removed from the first region. The forming of the etch-stop layer, the forming of the second oxide semiconductor material, the forming of the second gate insulating, and the sequential removing of the second gate insulating layer and the etch-stop layer may be performed between the forming of the first gate insulating material layer and the forming of the first gate electrode material layer. The first gate electrode material layer may be formed on the first gate insulating material layer of the first region and the second gate insulating material layer of the second region. The first gate electrode material layer and the second gate insulating material layer of the second region may be patterned so as to form the second stack structure on the second oxide semiconductor layer.

According to at least some example embodiments, the first and second oxide semiconductor layers may be the same type, and the first and second oxide semiconductor layers may be formed on the same layer.

Methods, according to at least some example embodiments, may further include forming a bottom gate electrode below at least one of the first and second oxide semiconductor layers.

The at least one of the first and second semiconductor layers may be formed as a multilayer structure including at least two layers. For example, the multilayer structure may be double-layer structure in which a first layer and a second layer are stacked sequentially. Alternatively, the multilayer structure may include at least three layers. In this case, the first layer may include ZnO-based oxide, whereas the second layer may include at least one of IZO, ITO, AZO, GZO, a mixture including at least one of the foregoing, or oxide having greater conductivity than that of the first layer.

According to at least some example embodiments, portions of the second oxide semiconductor layer may be plasma-treated, after forming the second stack structure, to form conductive regions in the portions of the second oxide semiconductor layer. The plasma-treated portions of the second oxide semiconductor layer may be disposed at each side of the second stack structure.

After performing the plasma-treating, second insulating spacers may be formed at each side wall of the second stack structure. The portions of the second oxide semiconductor layer at each side of the second stack structure and second insulating spacers may be plasma-treated again.

According to at least some example embodiments, the first source region and the first drain region may be formed by doping first type conductive impurities. The second source region and the second drain region may be formed by doping second type conductive impurities.

At least one example embodiment provides a transistor (e.g., a thin film transistor (TFT)). According to at least this example embodiment, the transistor includes a source region and a drain region formed on a substrate, and a channel region formed on the substrate between the source region and the drain region. The channel region is formed of an oxide semiconductor. The transistor further includes a stack structure including a gate insulating layer and a gate electrode stacked on the channel region. According to at least this example embodiment, the source and drain regions do not overlap the gate electrode.

At least one other example embodiment provides a method of manufacturing a transistor (e.g., thin film transistor (TFT)). According to at least this example embodiment, a source region, a drain region and a channel region are formed on a substrate. The channel region is formed between the source region and the drain region, and formed of an oxide semiconductor. A stack structure is formed on the channel region. The stack structure includes a gate insulating layer and a gate electrode stacked sequentially. The source and drain regions are formed such that the source and drain regions do not overlap the gate electrode.

At least one other example embodiment provides a transistor (e.g., a thin film transistor (TFT)). According to at least this example embodiment, the transistor includes a source region, a drain region and a channel region formed on a substrate. The channel region is formed between the source and drain regions. Each of the source and drain regions are formed of an oxide semiconductor and have an Indium-rich surface region. The transistor further includes a stack structure formed on the channel region. The stack structure includes a gate insulating layer and a gate electrode stacked sequentially.

At least one other example embodiment provides a method of manufacturing a transistor (e.g., a thin film transistor (TFT)). According to at least this example embodiment, a source region, a drain region and a channel region are formed on a substrate. Each of the source and drain regions are formed of an oxide semiconductor and have an Indium-rich surface region. A stack structure is formed on the channel region. The stack structure includes a gate insulating layer and a gate electrode stacked sequentially.

At least one other example embodiment provides a transistor (e.g., a thin film transistor (TFT)). According to at least this example embodiment, the transistor includes a source region, a drain region and a channel region formed on a substrate. Each of the source and drain regions are formed of an oxide semiconductor and have a plasma-treated surface region. The transistor further includes a stack structure formed on the channel region. The stack structure includes a gate insulating layer and a gate electrode.

At least one other example embodiment provides a method of manufacturing transistor (e.g., a thin film transistor (TFT)). According to at least this example embodiment, a source region, a drain region and a channel region are formed on a substrate. Each of the source and drain regions are formed of an oxide semiconductor and have a plasma-treated surface region. A stack structure is formed on the channel region. The stack structure includes a gate insulating layer and a gate electrode stacked sequentially.

At least one other example embodiment provides a method of manufacturing a self-aligning transistor (e.g., thin film transistor (TFT)). According to at least this example embodiment, a channel region is formed on a substrate between a source region and a drain region without one of crystallization and activation of the channel region. A stack structure is formed on the channel region. The stack structure includes a gate insulating layer and a gate electrode stacked sequentially. The source region and the drain region do not overlap the gate electrode.

According to at least some example embodiments, the source and drain regions may be formed of an oxide semiconductor. Each of the source and drain regions may have an Indium-rich surface region. Each of the source and drain regions may be formed of an oxide semiconductor. Each of the source and drain regions may have a plasma-treated surface region.

BRIEF DESCRIPTION OF THE DRAWINGS

The general inventive concept will become apparent and more readily appreciated from the following description of example embodiments, taken in conjunction with the accompanying drawings of which:

FIG. 2 is a cross-sectional view of a semiconductor device including a TFT of FIG. 1 according to an example embodiment;

FIGS. 7A through 7H are cross-sectional views for explaining a method of manufacturing a semiconductor device including the TFT of FIG. 3F according to another example embodiment;

DETAILED DESCRIPTION

Figure 1:
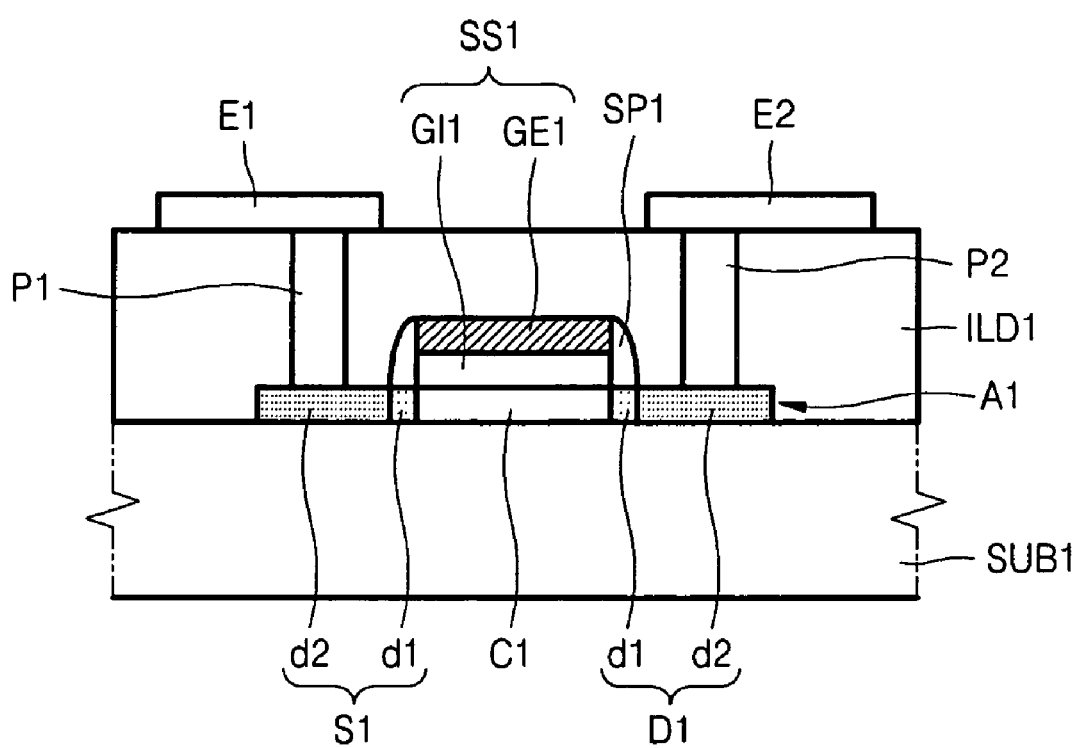
FIG. 1 shows a thin film transistor (TFT) according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. The general inventive concept may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 shows a thin film transistor (TFT) according to an example embodiment.

Referring to FIG. 1, a first active layer A1 is disposed on a substrate SUB1. The first active layer A1 may be formed of a first oxide semiconductor (sometimes referred to herein as an "oxide semiconductor material") of a first type. When the first type is an n-type oxide semiconductor, the first active layer A1 may be, for example, a ZnO-based oxide layer. In this case, the first active layer A1 may further include a group III element such as indium (In) or gallium (Ga), a group IV element such as tin (Sn), combinations thereof or other elements. When the first type is a p-type, the first active layer A1 may be, for example, a copper (Cu) oxide layer ($CuBO_2$ layer, $CuAlO_2$ layer, $CuGaO_2$ layer, $CuInO_2$ layer, etc.), a Nickel (Ni) oxide layer, a Ni oxide layer doped with titanium (Ti), a ZnO-based oxide layer doped with at least one of group I, II and V elements, a ZnO-based oxide layer doped with silver (Ag), a PbS layer, a LaCuOS layer, a LaCuOSe layer, a combination thereof or the like.

Still referring to FIG. 1, a first stack structure SS1 is disposed on a channel region (hereinafter, referred to as a first channel region C1) of the first active layer A1. The first stack structure SS1 includes a first gate insulating layer GI1 and a first gate electrode GE1. The first gate insulating layer GI1 and the first gate electrode GE1 are stacked sequentially. First insulating spacers SP1 are disposed at each side wall of the first stack structure SS1. A first source region S1 and a first drain region D1 are respectively disposed in portions of the first active layer A1 at each side wall of the first stack structure SS1. As shown in FIG. 1, the first source region S1 and the first drain region D1 do not overlap the first gate electrode GE1. Also, the first source region S1 and the first drain region D1 are coplanar with and do not overlap the first channel region C1.

Still referring to FIG. 1, each of the first source region S1 and the first drain region D1 include two regions (hereinafter, referred to as first and second conductive regions d1 and d2). The first and second regions d1 and d2 have different conductivities. The first conductive region d1 may be disposed adjacent to the first channel region C1. For example, the first conductive region may be below the first insulating spacer SP1. The conductivity of the first conductive region d1 may be smaller than the conductivity of the second conductive region d2.

In one example, the first conductive region d1 may be similar to a lightly doped drain (LDD) region. Each of the first source region S1 and the first drain region D1 may be plasma-treated. For example, when the portions of the first active layers A1 disposed at each side wall of the first stack structure SS1 are plasma-treated with single gas plasma (e.g., argon (Ar) plasma, xenon (Xe) plasma, hydrogen (H) plasma or hydrogen (H) containing gas plasma) or mixture gas plasma (e.g., plasma of mixture gas containing $SF_6$ and $O_2$), these portions of the first active layers A1 achieve a conductivity sufficient to serve as the first source region S1 and the first drain region D1, respectively. A period of time and/or the number of times the first conductive region d1 is plasma treated may be smaller than that of the second conductive region d2.

In an alternative example embodiment, the first source region S1 and the first drain region D1 may be doped with conductive impurities, instead of plasma-treated regions. In this case, the first conductive region d1 may be a relatively low concentration doping region, whereas the second conductive region d2 may be a relatively high concentration doping region. The first insulating spacer SP1 and the first conductive region d1 may be optionally provided.

A first interlayer insulating layer ILD1 covering the first stack structure SS1, the first insulating spacer SP1, the first source region S1 and the first drain region D1 may be disposed on the substrate SUB1. First and second electrodes E1 and E2 are disposed on the first interlayer insulating layer ILD1. The first and second electrodes E1 and E2 are electrically connected to the first source region S1 and the first drain region D1, respectively. For example, the first source region S1 and the first electrode E1 may be connected to each other by a first conductive plug P1. The first drain region D1 and the second electrode E2 may be connected to each other by a second conductive plug P2. A passivation layer (not shown) covering the first and second electrodes E1 and E2 may be disposed on the first interlayer insulating layer ILD1.

FIG. 2 is a cross-sectional view of a semiconductor device including a TFT according to an example embodiment. The semiconductor device according to at least this example embodiment includes a TFT (hereafter, referred to as a first type TFT Tr1) of FIG. 1 and a different type TFT (hereinafter, referred to as a second type TFT Tr2). The semiconductor device may be a complementary semiconductor device similar to a complementary metal oxide semiconductor (CMOS).

Referring to FIG. 2, the first type TFT Tr1 is disposed on a first region R1 of the substrate SUB1. The second type TFT Tr2 is disposed on a second region R2 of the substrate SUB1. The first type TFT Tr1 may be the same or substantially the same as the TFT of FIG. 1, and thus a detailed description thereof will be omitted. The second type TFT Tr2 may be disposed on an insulating layer IL1, which is disposed on the substrate SUB1. The insulating layer IL1 may be a single layer or a multilayer structure. For example, the insulating layer IL1 may include a first layer IM1 and a second layer ES1 disposed on the first layer IM1. In this case, the first layer IM1 may be formed of the same or substantially the same material as the first gate insulating layer GI1. The second layer ES1 may be formed of a different material from the first layer IM1. The etch selectivity between the first and second layers IM1 and ES1 may be relatively large. If necessary, the second layer ES1 may be omitted. The structure of the second type TFT Tr2 may be similar to that of the first type TFT Tr1. For example, the second type TFT Tr2 may include a second active layer A2 disposed on the insulating layer IL1, a second stack structure SS2 including a second gate insulating layer GI2 and a second gate electrode GE2, which are stacked sequentially on a channel region (hereinafter, referred to as a second channel region C2) of the second active layer A2. A second source region S2 and a second drain region D2 are disposed in portions of the second active layer A2 at each side of the second stack structure SS2. Second insulating spacers SP2 may be disposed at each side wall of the second stack structure SS2. The second active layer A2 may be an oxide semiconductor layer of an opposite type to the first active layer A1.

When the second active layer A2 is a p-type, the second active layer A2 may be, for example, a Cu oxide layer, an Ni oxide layer, an Ni oxide layer doped with Ti, a ZnO-based oxide layer doped with at least one of group I, II and V elements, or a ZnO-based oxide layer doped with Ag. When the second active layer A2 is an n-type, the second active layer A2 may be, for example, a ZnO-based oxide layer. In this case, the second active layer A2 may further include a group III element such as In or Ga, a group IV element such as Sn, a combination thereof or other elements.

Each of the second source region S2 and the second drain region D2 may include two regions (hereinafter, referred to as third and fourth conductive regions d3 and d4) having different conductivities. The third conductive region d3 may be disposed adjacent to the second channel region C2. The third conductive region d3 may be disposed below the second insulating spacer SP2. The conductivity of the third conductive region d3 may be smaller than that of the fourth conductive region d4. For example, the third conductive region d3 may be similar to an LDD region. Similar to the first source region S1 and the first drain region D1, each of the second source region S2 and the second drain region D2 may be a plasma-treated region or a region doped with conductive impurities.

According to at least some example embodiments, the second insulating spacer SP2 and the third conductive region d3 are optional.

Still referring to FIG. 2, a first interlayer insulating layer ILD1 covering the second stack structure SS2, the second insulating spacer SP2, the second source region S2 and the second drain region D2 is disposed on the insulating layer IL1. Third and fourth electrodes E3 and E4 are disposed on the first interlayer insulating layer ILD1. The third and fourth electrodes E3 and E4 are electrically connected to the second source region S2 and the second drain region D2. The second source region S2 and the third electrode E3 may be connected to each other by a third conductive plug P3. The second drain region D2 and the fourth electrode E4 may be connected to each other by a fourth conductive plug P4. A passivation layer (not shown) covering the third and fourth electrodes E3 and E4 may be disposed on the first interlayer insulating layer ILD1.

According to at least this example embodiment, a TFT includes an oxide semiconductor channel region. The oxide semiconductor layer (from which the channel region is formed) may have uniform electric characteristics across its entire area unlike a polycrystal silicon layer. Thus, a relatively large size display apparatus including the TFT may be realized. In addition, when the oxide semiconductor channel region is used, de-hydrogen and crystallization processes are not required to form the channel layer. Because a source region and a drain region may be formed by only plasma-treating, instead of an impurity-doping process and an activation process, manufacturing processes may be simplified and/or manufacturing costs may be reduced. Moreover, TFTs according to example embodiments may be formed on plastic substrates because high heat processes such as annealing are not required.

In addition, TFTs according to at least this example embodiment have a self-align top gate structure. In this regard, the source region and the drain region may not overlap a gate electrode. As a result, this structure may be usable in scaling-down devices and/or improving operating speeds. Because the channel region is formed of an oxide semiconductor, which has greater charge mobility than an amorphous silicon layer or a polycrystal silicon layer, TFTs according to at least this example embodiment may provide display apparatuses having improved operating speeds.

FIGS. 3A through 3F are cross-sectional views for explaining a method of manufacturing a TFT according to an example embodiment.

Figure 3A:
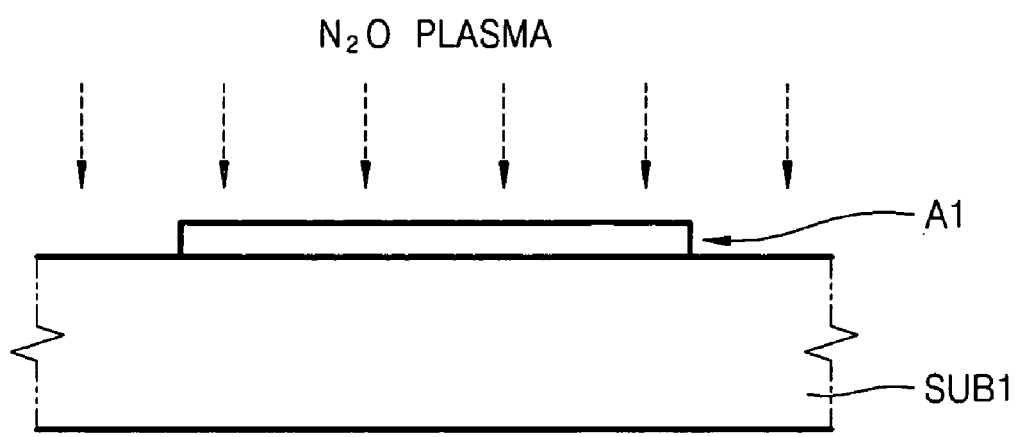
FIGS. 3A through 3F are cross-sectional views for explaining a method of manufacturing a TFT according to an example embodiment.
Figure 3B:
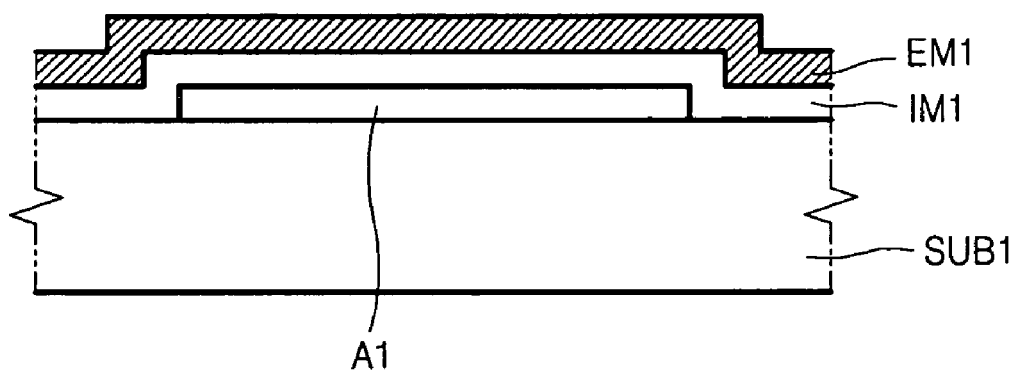

Referring to FIG. 3A, a first active layer A1 is formed on a substrate SUB1. The first active layer A1 may be formed of a first oxide semiconductor of a first type. When the first type is an n-type, the first active layer A1 may be, for example, a ZnO-based oxide layer. In this case, the first active layer A1 may further include a group III element such as In or Ga, a group IV element such as Sn, a combination thereof or other elements. When the first type is a p-type, the first active layer A1 may be, for example, a Cu oxide layer ($CuBO_2$ layer, $CuAlO_2$ layer, $CuGaO_2$ layer, $CuInO_2$ layer, etc.), a Ni oxide layer, a Ni oxide layer doped with Ti, a ZnO-based oxide layer doped with at least one of group I, II and V elements, a ZnO-based oxide layer doped with Ag, a PbS layer, a LaCuOS layer or a LaCuOSe layer.

The first active layer A1 may be plasma-treated. The plasma may be oxygen containing gas plasma, for example, $N_2O$ plasma. When the first active layer A1 is plasma-treated, oxygen may permeate a surface portion of the first active layer A1, thereby reducing the conductivity of the surface portion of the first active layer A1. When a first insulating material layer IM1 (see FIG. 3B) is deposited on the first active layer A1, hydrogen may permeate a surface portion of the first active layer A1, thereby increasing the conductivity of the surface portion of the first active layer A1 back to a level of semiconductor conductivity. If the above plasma-treating is not performed prior to forming the first insulating material layer IM1, the semiconductor properties of the first active layer A1 become the same or substantially the same as metallic properties because the conductivity of the surface portion of the first active layer A1 increases too much. Performing the plasma-treatment prior to the forming of the first insulating material layer IM1 reduces the conductivity such that this does not occur. However, depending on the material of the first active layer A1 and the gas used for forming the first insulating material layer IM1, the plasma-treatment with respect to the first active layer A1 may be omitted.

Figure 4A:
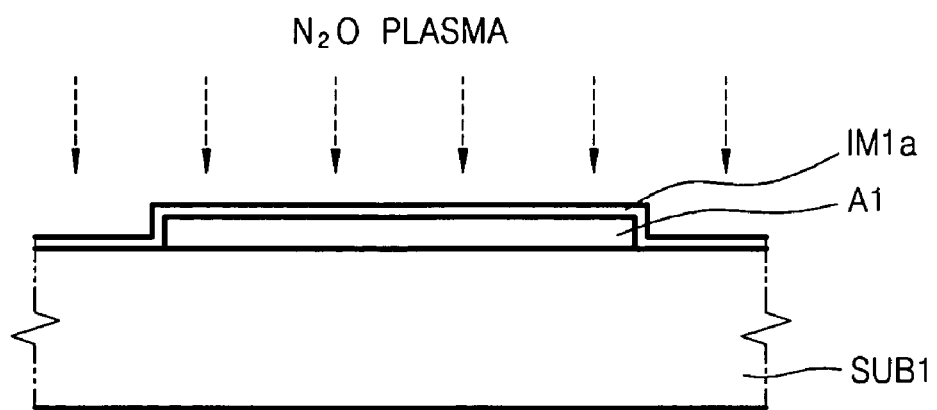
FIGS. 4A and 4B are cross-sectional views for explaining steps of a method of manufacturing a TFT according to another example embodiment.
Figure 4B:
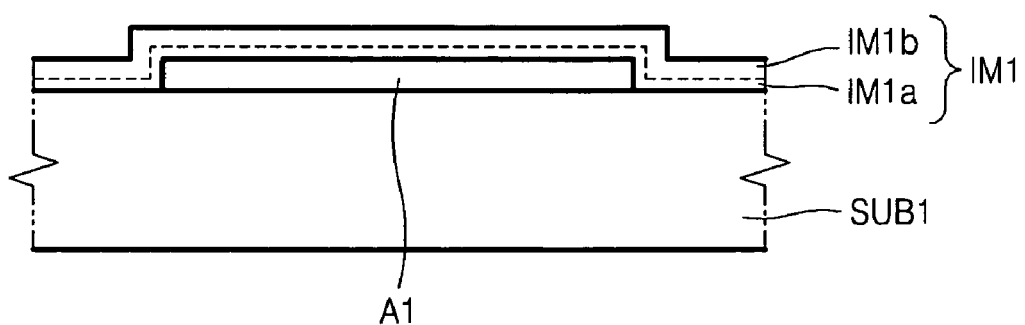

The plasma-treating with respect to the first active layer A1, illustrated in FIG. 3A, may be variously changed. For example, as illustrated in FIGS. 4A and 4B, the first insulating material layer IM1 may be formed using at least two operations or actions. The first active layer A1 may be plasma-treated between the at least two operations. In more detail, as illustrated in FIG. 4A, when a portion (hereinafter referred to as a lower layer IM1a) of the first insulating material layer IM1 is formed, the first active layer A1 is plasma-treated. Then, as illustrated in FIG. 4B the other portion (hereinafter referred to as an upper layer IM1b) of the first insulating material layer IM1 is formed. In this case, the thickness of the lower layer IM1a may be smaller than the thickness of the upper layer IM1b. This is because if the lower layer IM1a is excessively thick, it may be more difficult to plasma-treat the first active layer A1. In addition, the hydrogen concentration of hydrogen in a deposition gas used for forming the lower layer IM1a may be smaller than in the case of the upper layer IM1b to reduce the amount of hydrogen permeating the first active layer A1 when forming the lower layer IM1a.

Although not illustrated, according to yet another example embodiment the first active layer A1 may be plasma-treated after forming the first insulating material layer IM1. In this case, the intensity of the plasma may be relatively large, and the thickness of the first insulating material layer IM1 may be relatively small.

Referring back to FIG. 3B, a first insulating material layer IM1 covering the first active layer A1 is formed on the substrate SUB1. The first insulating material layer IM1 may be, for example, a silicon oxide layer. In this case, the first insulating material layer IM1 may be formed by plasma enhanced chemical vapor deposition (PECVD) using, for example, $SiH_4$ containing gas. A first electrode material layer EM1 is formed on the first insulating material layer IM1.

Figure 3C:
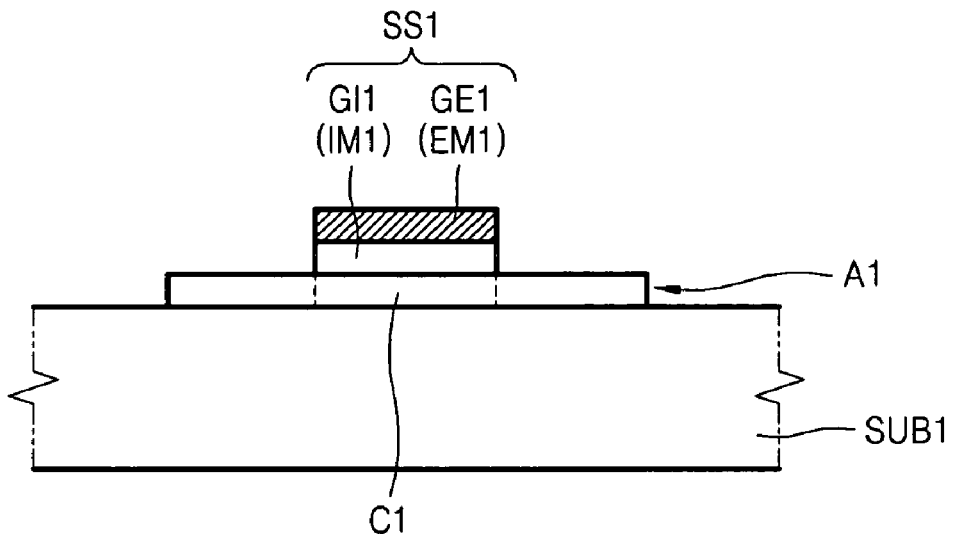

The first electrode material layer EM1 and the first insulating material layer IM1 are sequentially etched to form the first stack structure SS1 on a channel region (referred to as a first channel region C1) of the first active layer A1, as illustrated in FIG. 3C. When the first electrode material layer EM1 and the first insulating material layer IM1 are etched, a mixture gas of $SF_6$ and $O_2$ may be used as an etching gas. In FIG. 3C, reference numeral GI1 denotes an etched first insulating material layer (hereinafter, referred to as a first gate insulating layer GI1), and reference numeral GE1 denotes an etched first electrode material layer (hereinafter, referred to as a first gate electrode GE1).

Figure 3D:
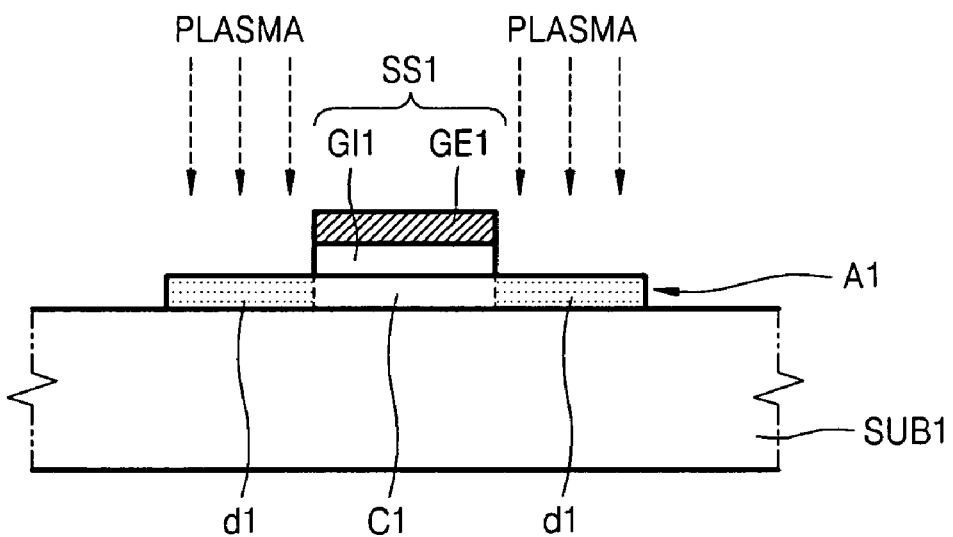

Referring to FIG. 3D, a first plasma treatment is performed with respect to portions of the first active layer A1 disposed at each side of the first stack structure SS1 so that first conductive regions d1 are formed in these portions of the first active layers A1. The first conductive regions d1 may have conductivity similar or substantially similar to that of a general LDD region. The above first plasma treatment may be performed with the etching gas (e.g., a mixture gas of $SF_6$ and $O_2$) plasma used for etching the first electrode material layer EM1 and the first insulating material layer IM1 illustrated in FIG. 3B. Alternatively, other plasma, for example, argon (Ar) plasma, xenon (Xe) plasma, hydrogen (H) plasma or hydrogen (H) containing gas plasma may be used. By the first plasma treatment, the composition of the surface portion of the first active layer A1 may be changed, thereby increasing the conductivity of the surface portion of the first active layer A1. In more detail, if the first active layer A1 is a gallium-indium-zinc-oxide (GaInZnO) layer, the In concentration of a surface portion of the GaInZnO layer may be increased as a result of the first plasma treatment, thereby increasing the conductivity of the surface portion of the GaInZnO layer. For example, the sheet resistance of the plasma-treated first conductive region d1 may be about 50 k$\Omega$/sq.

Figure 3E:
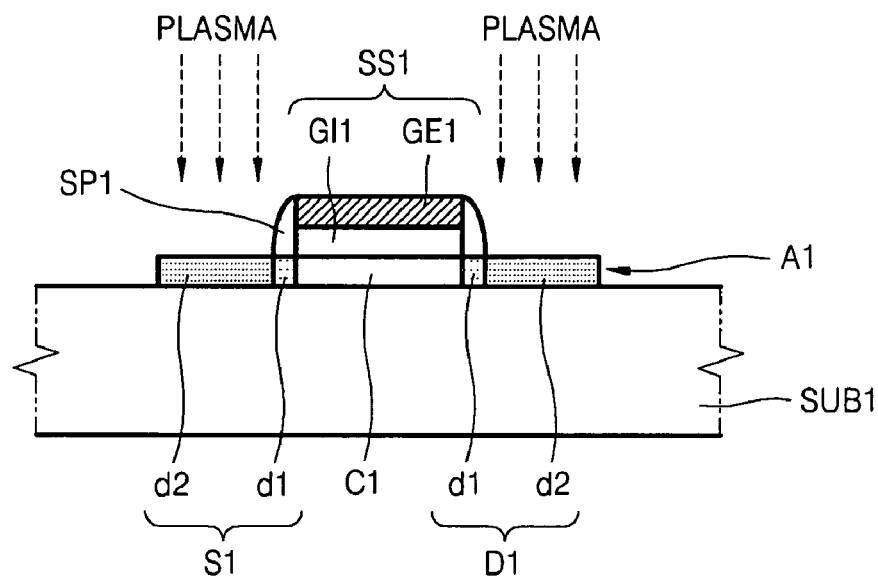
Figure 5:
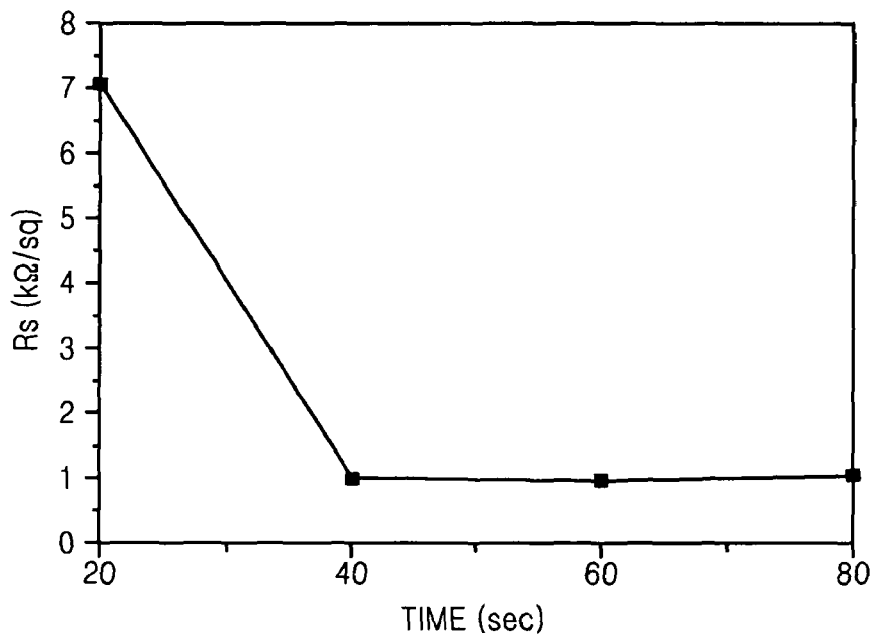
FIG. 5 is a graph illustrating a sheet resistance with respect to a period of time during which plasma-treating is performed with respect to an active layer included in a TFT according to an example embodiment.

Referring to FIG. 3E, first insulating spacers SP1 are formed at each side wall of the first stack structure SS1. A second plasma-treatment may be performed to the first conductive regions d1 disposed on at each side of the first stack structure SS1 and the first insulating spacer SP1 to form second conductive regions d2. The first and second conductive regions d1 and d2 of one side of the first stack structure SS1 may be a first source region S1. The first and second conductive regions d1 and d2 of the other side of the first stack structure SS1 may be a first drain region D1. Because a second plasma-treated region (e.g., the second conductive region d2) has a relatively high conductivity, the second conductive region d2 may be similar or substantially similar to a region relatively highly doped with conductive impurities. By the second plasma-treatment, the composition of the surface portion of the first active layer A1 may also be changed, thereby further increasing the conductivity of the surface portion of the first active layer A1. For example, the sheet resistance of the further plasma-treated second conductive region d2 may be about 1 kΩ/sq. Example variation in the sheet resistance $R_s$ of the second conductive region d2, which is changed according to a period of time during which the second plasma-treatment is performed, is shown in FIG. 5. When performing the second plasma-treatment, argon (Ar) plasma, xenon (Xe) plasma, hydrogen (H) plasma, hydrogen (H) containing gas plasma or other plasma may be used.

Figure 3F:
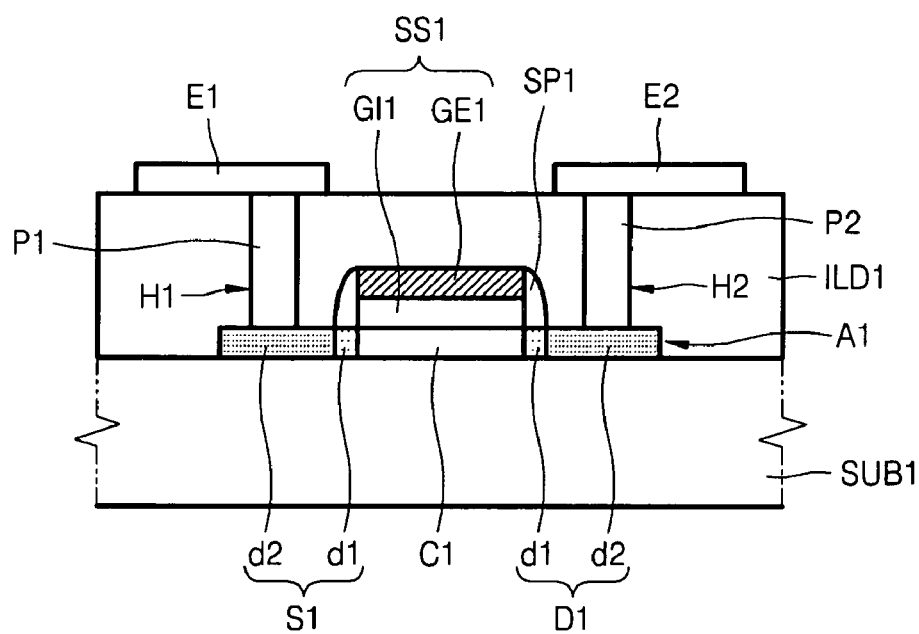

Referring to FIG. 3F, a first interlayer insulating layer ILD1 covering the first stack structure SS1, the first insulating spacer SP1, the first source region S1 and the first drain region D1 may be formed on the substrate SUB1. First and second contact holes H1 and H2 are formed by etching the first interlayer insulating layer ILD1. The first and second contact holes H1 and H2 expose the first source region S1 and the first drain region D1, respectively. The first conductive plug P1 and the second conductive plug P2 may be formed in the first and second contact holes H1 and H2, respectively. The first electrode E1 and the second electrode E2 may be formed on the first interlayer insulating layer ILD1. The first electrode E1 contacts the first conductive plug P1 and the second electrode E2 contacts the second conductive plug P2. Although not illustrated, a passivation layer covering the first and second electrodes E1 and E2 may further be formed on the first interlayer insulating layer ILD1. In addition, after forming the passivation layer, annealing may be performed on the substrate SUB1 at a given, desired or predetermined temperature to increase properties of the TFT.

Figure 6:
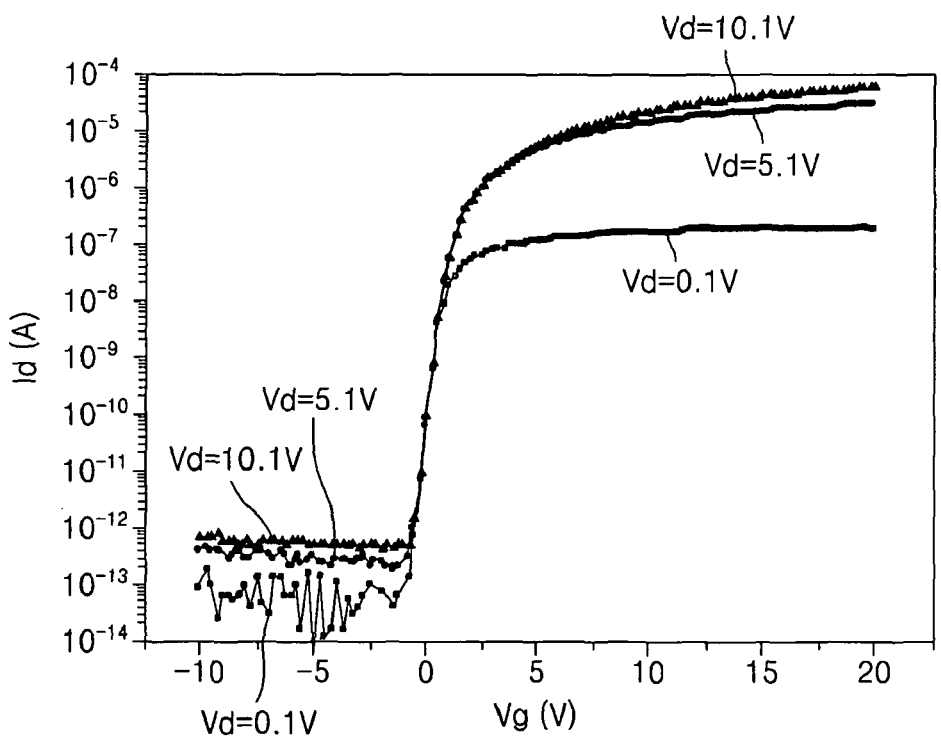
FIG. 6 is a graph illustrating gate voltage—drain current characteristics versus a drain voltage of the TFT of FIG. 3F.

FIG. 6 is a graph illustrating gate voltage $V_g$-drain current $I_d$ characteristics versus a drain voltage $V_d$ of the TFT of FIG. 3F. As shown in FIG. 6, the TFT according to at least this example embodiment has improved (e.g., excellent) switching characteristics even when using a relatively low drain voltage $V_d$ of about 0.1V.

The TFT may also have a self-align top gate structure where locations of a source and drain regions are automatically determined according to a location of a gate electrode, and in which source and drain regions do not overlap a gate electrode. Also, because started from the same semiconductor oxide layer, the source region, the channel region, and the drain region are coplanar and do not overlap with each other. Because the TFT has an oxide semiconductor layer as a channel layer, de-hydrogen and crystallization are not required for forming the channel layer. In addition, because the source region and the drain region may be formed by only plasma-treating, instead of impurity-doping and activation, a manufacturing process may be simplified and/or manufacturing costs may be reduced.

FIGS. 7A through 7H are cross-sectional views for explaining a method of manufacturing a semiconductor device including the TFT of FIG. 3F according to another example embodiment. The semiconductor device according to at least this example embodiment may be a complementary semiconductor device.

Referring to FIG. 7A, a substrate SUB1 including first and second regions R1 and R2 may be prepared. One of the first and second regions R1 and R2 may be a region for forming an n-channel transistor, and the other one of first and second regions R1 and R2 may be a p-channel transistor. A first active layer A1 is formed on the first region R1 of the substrate SUB1. The first active layer A1 may be the same or substantially the same as the first active layer A1 illustrated in FIGS. 1 and 2. The first active layer A1 may be one of an n-type oxide semiconductor layer and a p-type oxide semiconductor layer.

A first insulating material layer IM1 covering the first active layer A1 is formed on an entire surface of the substrate SUB1. Prior to or after forming the first insulating material layer IM1, the first active layer A1 may be plasma-treated. Alternatively, the first insulating material layer IM1 may be formed using two operations, and the first active layer A1 may be plasma-treated between the two operations. The above-mentioned plasma-treatment may be the same or substantially the same as that described with reference to FIGS. 3A, 4A, and 4B.

Still referring to FIG. 7A, an etch-stop layer ES1 is formed on an entire surface of the first insulating material layer IM1. A second active layer A2 is formed on the etch-stop layer ES1 of the second region R2. The second active layer A2 may be of an opposite type to the first active layer A1. In this example, the first active layer A1 is an n-type oxide semiconductor layer and the second active layer A2 is a p-type oxide semiconductor layer.

Still referring to FIG. 7A, a second insulating material layer IM2 covering the second active layer A2 is formed on the etch-stop layer ES1 of the first and second regions R1 and R2. Prior to, or after, forming the second insulating material layer IM2, the second active layer A2 may be plasma-treated. Alternatively, the second insulating material layer IM2 may be formed using two operations, and the second active layer A2 may be plasma-treated between the two operations. The above plasma processing may be the same or substantially the same as the plasma processing with respect to the first active layer A1 described with reference to FIGS. 3A, 4A and 4B. The first insulating material layer IM1 and the second insulating material layer IM2 may be formed of the same or substantially the same material, for example, silicon oxide, and the etch-stop layer ES1 may be formed of a material (e.g., silicon nitride) having relatively large etch selectivity with respect to the first insulating material layer IM1 and the second insulating material layer IM2.

Figure 7B:
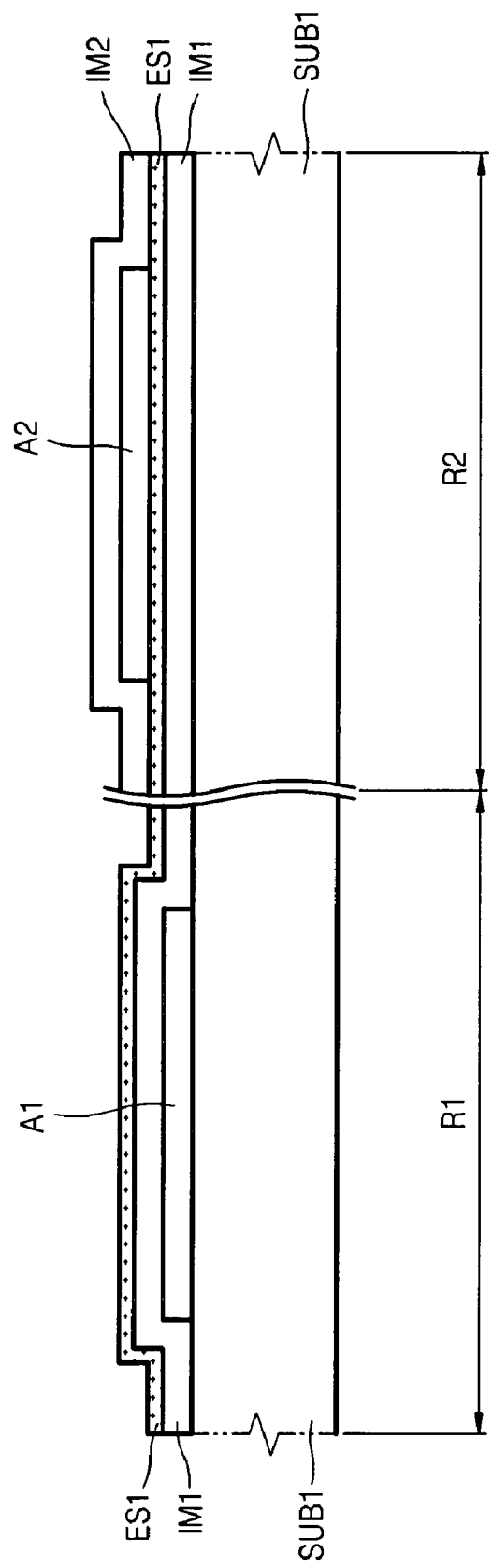

By etching the second insulating material layer IM2 of the first region R1, the etch-stop layer ES1 is exposed as illustrated in FIG. 7B.

Figure 7C:
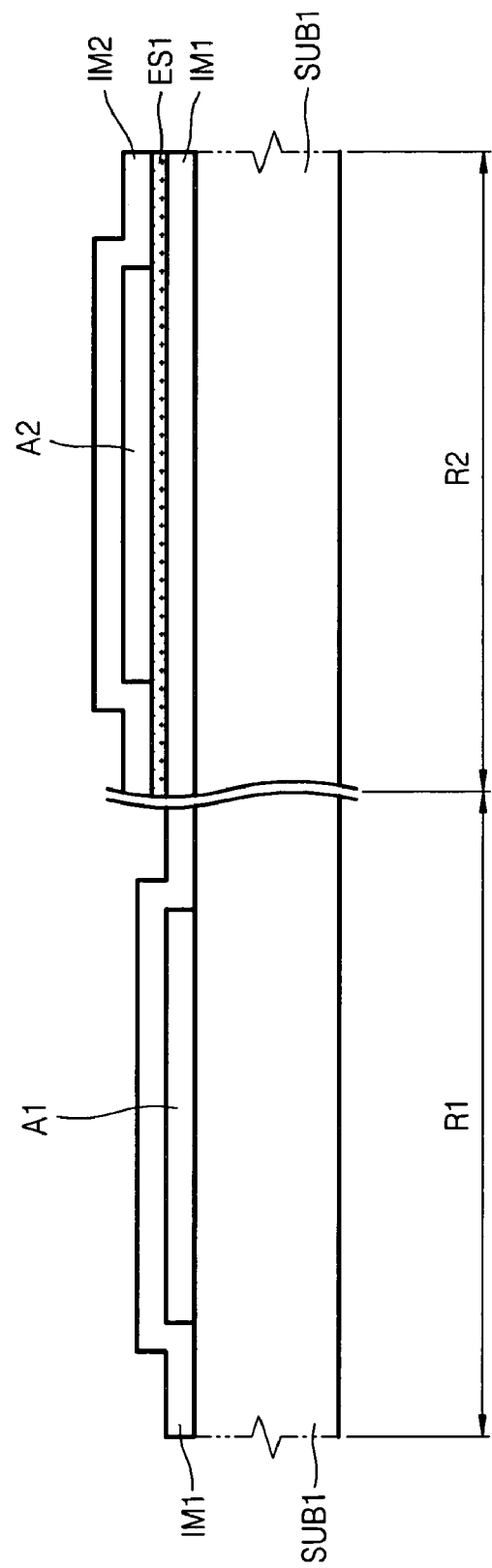

By etching the etch-stop layer ES1 of the first region R1, the first insulating material layer IM1 is exposed as illustrated in FIG. 7C. At this time, by using an etching gas or an etching solution, which selectively etches the etch-stop layer ES1, damage in the first insulating material layer IM1 may be suppressed (e.g., prevented and/or minimized). However, if the first insulating material layer IM1 and the second insulating material layer IM2 are formed of different materials and etch selectivity between the materials is relatively large, the etch-stop layer ES1 may not be formed. Thus, the etch-stop layer ES1 is optional.

Although not illustrated, in FIGS. 7B and 7C, when etching the second insulating material layer IM2 and the etch-stop layer ES1 of the first region R1, the second region R2 may be covered by a mask layer.

Referring to FIG. 7D, a first electrode material layer EM1 is formed on the first insulating material layer IM1 of the first region R1 and the second insulating material layer IM2 of the second region R2.

Figure 7E:
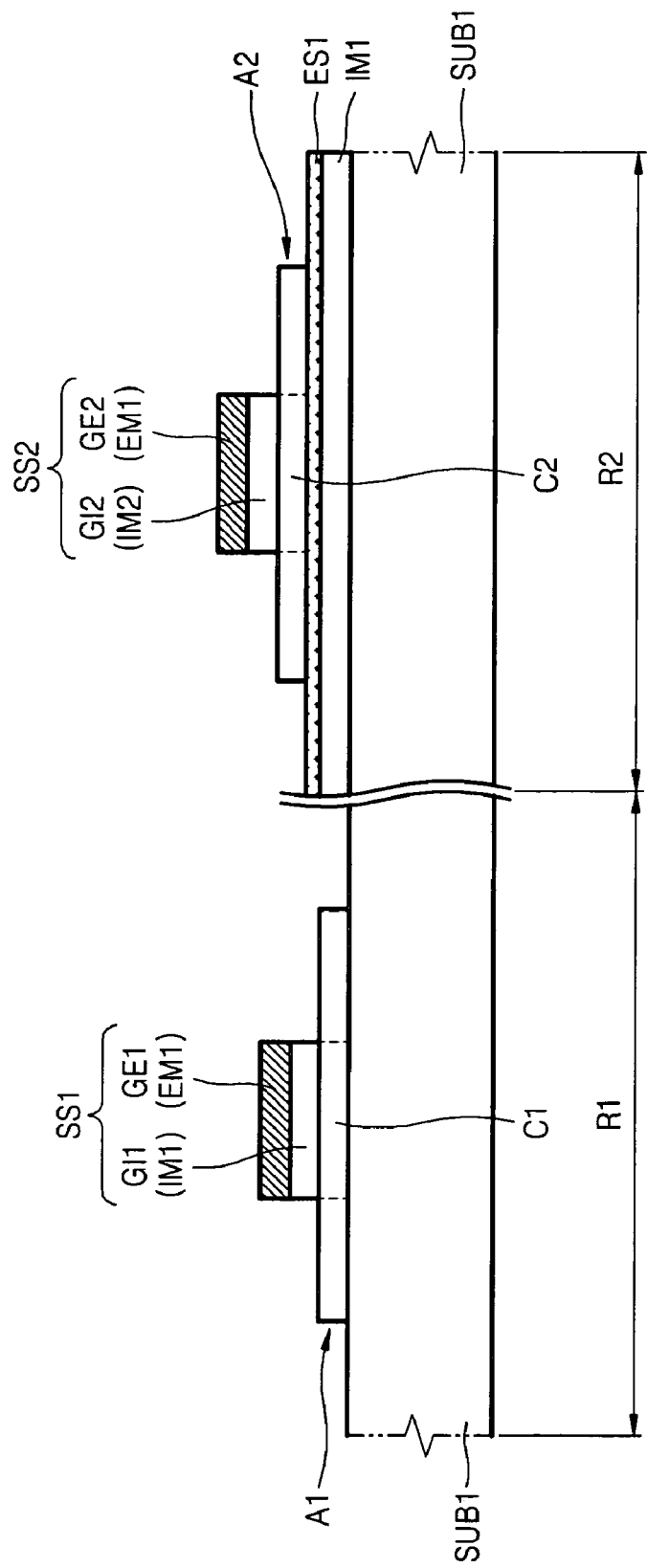

The first electrode material layer EM1, the first insulating material layer IM1 and the second insulating material layer IM2 are patterned, and the resultant product is illustrated in FIG. 7E. Hereinafter, a patterned first insulating material layer IM1 and a patterned second insulating material layer IM2 are referred to as a first gate insulating layer GI1 and a second gate insulating layer GI2, respectively. The remaining first electrode material layer EM1 of the first region R1 and the remaining first electrode material layer EM1 of the second region R2 are referred to as a first gate electrode GE1 and a second gate electrode GE2, respectively. The first gate insulating layer GI1 and the first gate electrode GE1 may be formed on a first channel region C1 of the first active layer A1 so as to constitute the first stack structure SS1. The second gate insulating layer GI2 and the second electrode GE2 may be formed on a second channel region C2 of the second active layer A2 so as to constitute the second stack structure SS2.

Figure 7F:
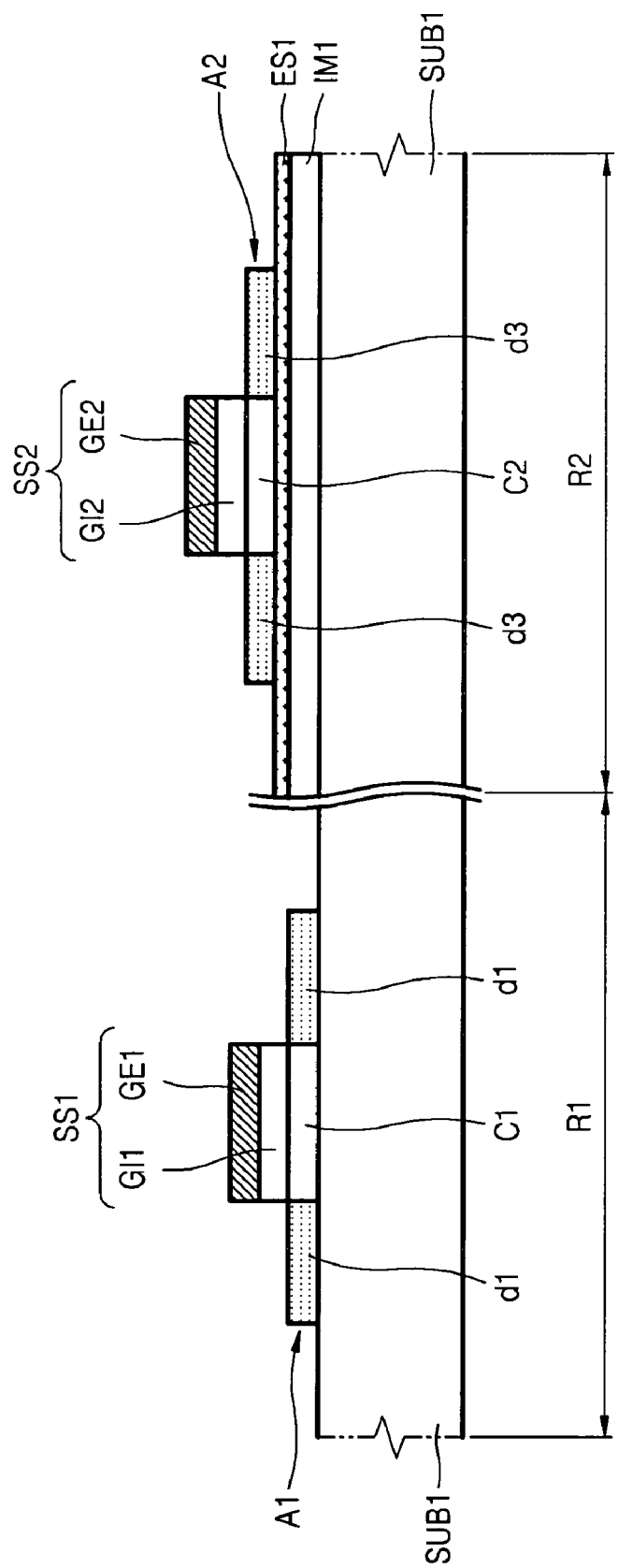

Referring to FIG. 7F, portions of the first active layer A1 disposed at each side of the first stack structure SS1 are plasma treated to form first conductive regions d1. Portions of the second active layer A2 disposed at each side of the second stack structure SS2 are also plasma treated to form third conductive regions d3. The first and third conductive regions d1 and d3 may have similar or substantially similar conductivity to that of a general LDD region. The first plasma-treatment may be the same or substantially the same as that described with reference to FIG. 3D.

Figure 7G:
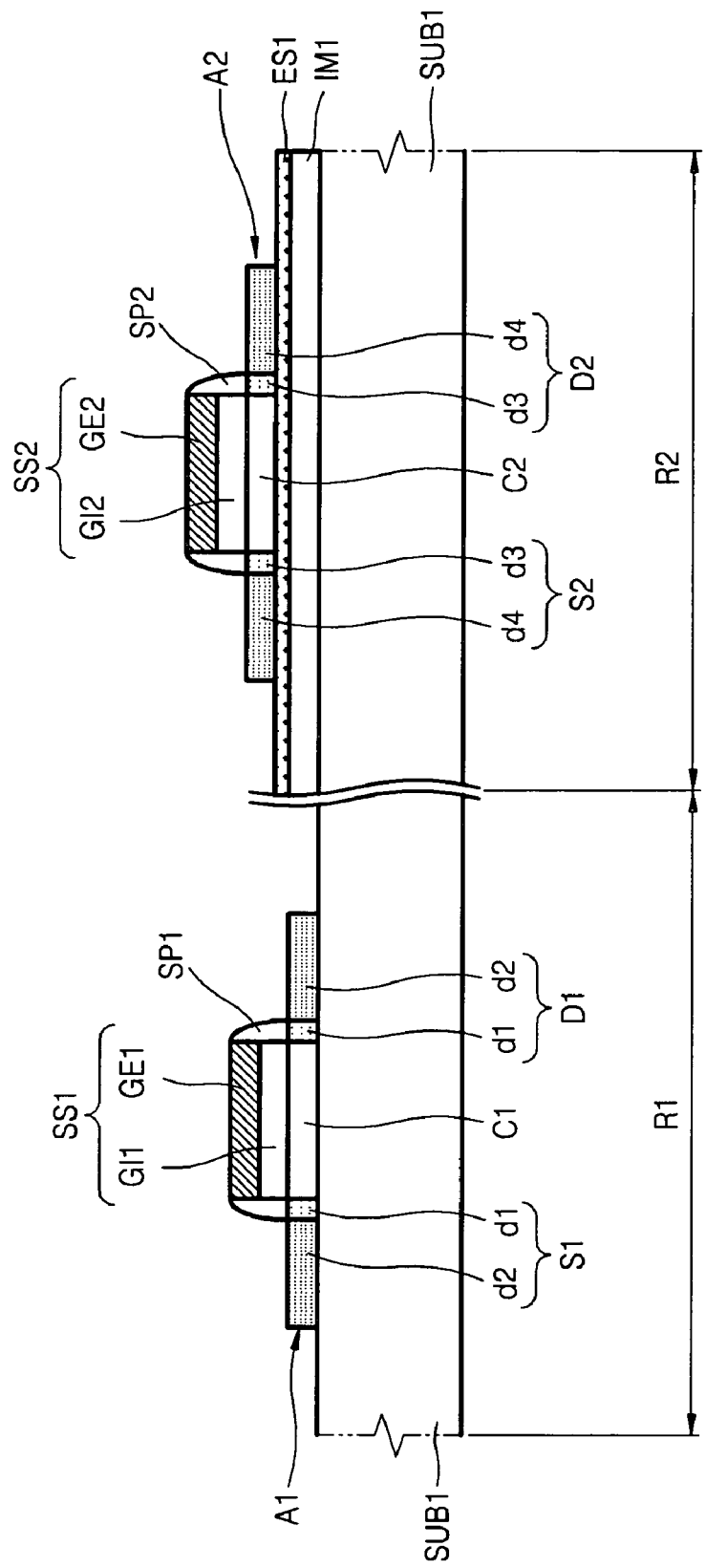

Referring to FIG. 7G, first insulating spacers SP1 are formed at each side wall of the first stack structure SS1. The second insulating spacers SP2 are formed at each side wall of the second stack structure SS2.

A second plasma-treatment is performed with respect to the first conductive regions d1 at each side of the first insulating spacer SP1 and the first stack structure SS1 to form second conductive regions d2. A second plasma-treatment is also performed with respect to the third conductive regions d3 at each side of the second insulating spacer SP2 and the second stack structure SS2 to form fourth conductive regions d4. The first and second conductive regions d1 and d2 at one side of the first stack structure SS1 may serve as the first source region S1, and the first and second conductive regions d1 and d2 at the other side of the first stack structure SS1 may serve as the first drain region D1. The third and fourth conductive regions d3 and d4 at one side of the second stack structure SS2 may serve as the second source region S2, and the third and fourth conductive regions d3 and d4 at the other side of the second stack structure SS2 may serve as the second drain region D2. The second plasma-treating may be the same or substantially the same as that described with reference to FIG. 3E.

Referring to FIG. 7H, a first interlayer insulating layer ILD1 covering the first stack structure SS1, the first insulating spacer SP1, the first source region S1 and the first drain region D1 of the first region R1, and the second stack structure SS2, the second insulating spacer SP2, the second source region S2 and the second drain region D2 of the second region R2 may be formed. First, second, third and fourth contact holes H1, H2, H3 and H4 are formed by etching the first interlayer insulating layer ILD1. The first contact hole H1 exposes the first source region S1. The second contact hole H2 exposes the first drain region D1. The third contact hole H3 exposes the second source region S2, and The fourth contact hole H4 exposes the second drain region D2.

First through fourth conductive plugs P1 through P4 are formed in the first through fourth contact holes H1 through H4, respectively. First through fourth electrodes E1 through E4 are formed on the first interlayer insulating layer ILD1. The first through fourth electrodes E1 through E4 contact the first through fourth conductive plugs P1 through P4, respectively.

Although not illustrated, a passivation layer covering the first through fourth electrodes E1 through E4 may be formed on the first interlayer insulating layer ILD1. In addition, after the forming of the passivation layer, annealing may be performed on the substrate SUB1 at a given, desired or predetermined temperature to increase the properties of the TFTs.

In the above-described example embodiments, a source region and a drain region are formed by plasma-treating. However, instead of the plasma-treating, the source region and the drain region may be formed by doping a material with conductive impurities and then activating the material to activate the doped impurities.

For example, in FIG. 3E first type conductive impurities may be injected into each end of the first active layer A1, and an activating operation (e.g., annealing) may be performed thereby forming the first source region S1 and the first drain region D1. In another example with respect to FIG. 7G, the first type conductive impurities may be injected into the first conductive region d1 at each side of the first stack structure SS1 and first insulating spacer SP1, second type conductive impurities may be injected into the third conductive region d3 at each side of the second stack structure SS2 and second insulating spacer SP2. Activation (e.g., annealing) may be performed to form the first and second source regions S1 and S2 and the first and second drain regions D1 and D2. In another alternative, the plasma-treating, the doping with impurities and the activating operation may be used together.

Example embodiments of TFTs illustrated in FIGS. 1 through 7H have single gate structures. But, other example embodiments may have a double gate structure.

Figure 8:
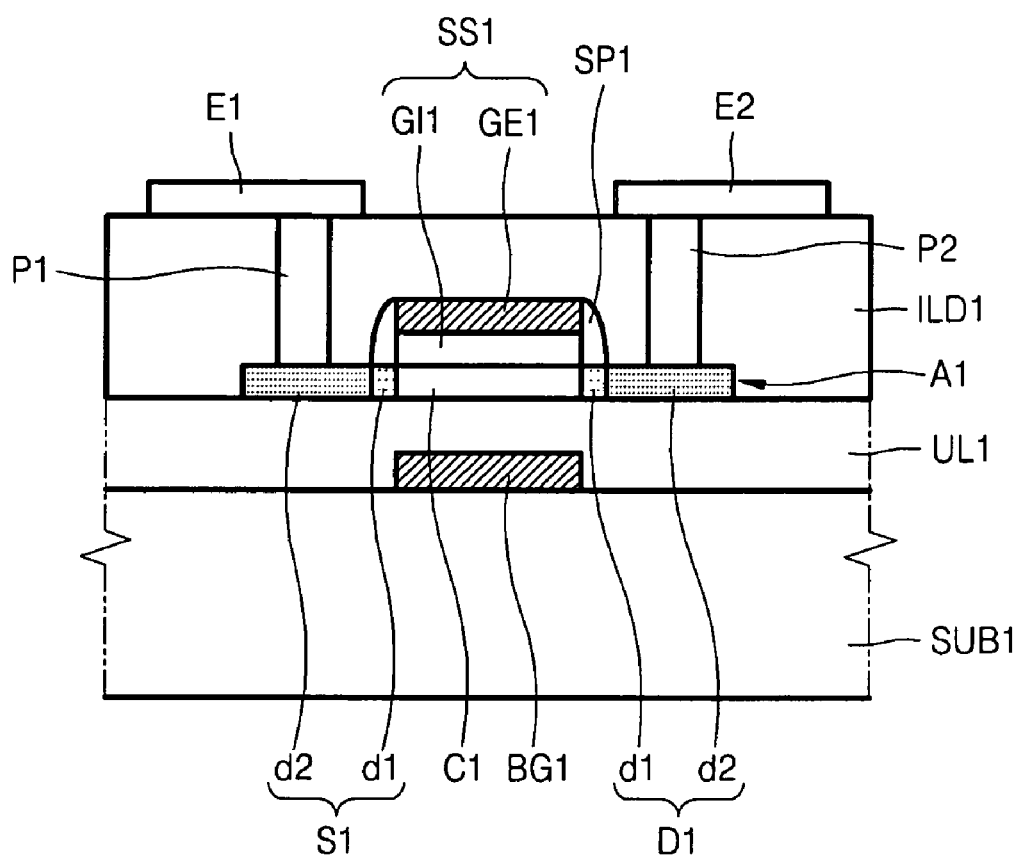
FIG. 8 is a cross-sectional view of a TFT according to another example embodiment.

FIG. 8 shows a TFT according to another example embodiment. The TFT of FIG. 8 has a structure in which a first bottom gate electrode BG1 and a lower insulating layer UL1 are added to the TFT of FIG. 1.

Referring to FIG. 8, the first bottom gate electrode BG1 and the lower insulating layer UL1 covering the first bottom gate electrode BG1 are disposed on a substrate SUB1. The lower insulating layer UL1 may be a silicon oxide layer, a silicon nitride layer, a combination thereof or other insulating material layer. The TFT of FIG. 1 is disposed on the lower insulating layer UL1. In this example, the first channel region C1 is disposed above the first bottom gate electrode BG1. Thus, the first channel region C1 is controlled by the first bottom gate electrode BG1 disposed under the first channel region C1 and the first gate electrode GE1 disposed above the first channel region C1. The first bottom gate electrode BG1 may be separated from or electrically connected to the first gate electrode GE1. When the first bottom gate electrode BG1 is connected to the first gate electrode GE1, the first bottom gate electrode BG1 and the first gate electrode GE1 may be connected to each other by a conductive plug. Because the TFT of FIG. 8 has a double gate structure, a threshold voltage may be controlled more easily. For example, when a given, desired or predetermined negative (−) voltage is applied to any one of the first bottom gate electrode BG1 and the first gate electrode GE1, a depletion region may be formed in the first channel region C1 and the number of electrons of the first channel region C1 may be reduced. Thus, it may be more difficult to form an n-channel in the first channel region C1. This indicates a threshold voltage increase. In other words, when a given, desired or predetermined negative (−) voltage is applied to the first bottom gate electrode BG1, an n-channel may be formed in the first channel region C1 if (e.g., only if) a first voltage is applied to the first gate electrode GE1. But, the first voltage is greater than a voltage applied to the first gate electrode GE1 in which the given, desired or predetermined negative (−) voltage is not applied to the first bottom gate electrode BG1. Thus, the TFT of FIG. 8 may be an enhancement mode transistor having a threshold voltage greater than about 0 V.

When a given, desired or predetermined positive (+) voltage is applied to any one of the first bottom gate electrode BG1 and the first gate electrode GE1, a threshold may be reduced because the number of electrons in the first channel region C1 increases. In this case, the TFT of FIG. 8 may be a depletion mode transistor having a threshold voltage smaller than about 0V. Likewise, a threshold voltage may be controlled more easily by applying a negative (−) or positive (+) voltage to any one of double gates. In this case, when a voltage for controlling a threshold voltage is applied to any one of double gates, a normal operation voltage may be applied to the other one of the double gates.

In addition, when a given, desired or predetermined positive (+) voltage is applied to the first bottom gate electrode BG1 and the first gate electrode GE1 simultaneously or concurrently, a threshold voltage of a transistor may be changed. For example, the threshold voltage of the transistor may be increased by the given, desired or predetermined positive (+) voltage. With regard to this mechanism, electrons may be trapped in the lower insulating layer UL1 (e.g., a gate insulating layer) between the first bottom gate electrode BG1 and the first channel region C1 by the given, desired or predetermined positive (+) voltage applied to the first bottom gate electrode BG1. Likewise, electrons may be trapped in the first gate insulating layer GI1 by the given, desired or predetermined positive (+) voltage applied to the first gate electrode GE1, and it may be more difficult to form an n-channel in the first channel region C1 by the trapped electrons. However, a threshold voltage may be increased by other factors.

When a threshold voltage of a transistor increases by applying a positive (+) voltage to the first bottom gate electrode BG1 and the first gate electrode GE1, a TFT may be operated by increasing a threshold voltage and then applying a normal operation voltage to at least one of the first bottom gate electrode BG1 and the first gate electrode GE1 because the increased threshold voltage may be maintained.

According to at least this example embodiment, a threshold voltage of an oxide TFT may be controlled more easily, and/or an enhancement mode transistor or a depletion mode transistor may be embodied more easily.

The TFT of FIG. 8 may be manufactured by forming the first bottom gate electrode BG1 on the substrate SUB1, forming the lower insulating layer UL1 covering the first bottom gate electrode BG1 and then forming the TFT of FIG. 1 on the lower insulating layer UL1. The method of forming the TFT of FIG. 1 may be the same or substantially the same as the method illustrated in FIGS. 3A through 3F or FIGS. 4A through 4B.

Figure 9:
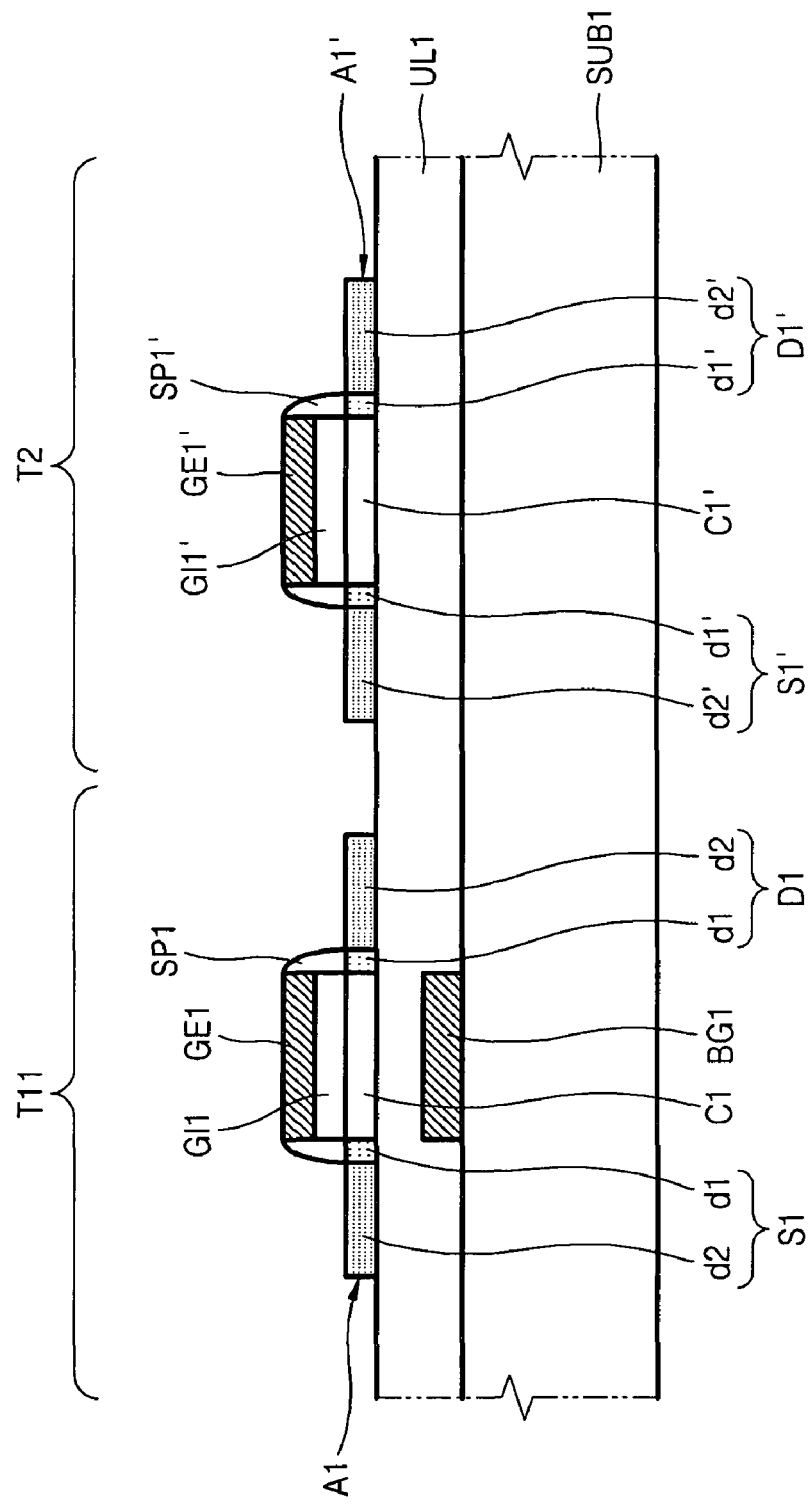
FIGS. 9 and 10 are cross-sectional views of a semiconductor device including TFTs according to example embodiments.
Figure 10:
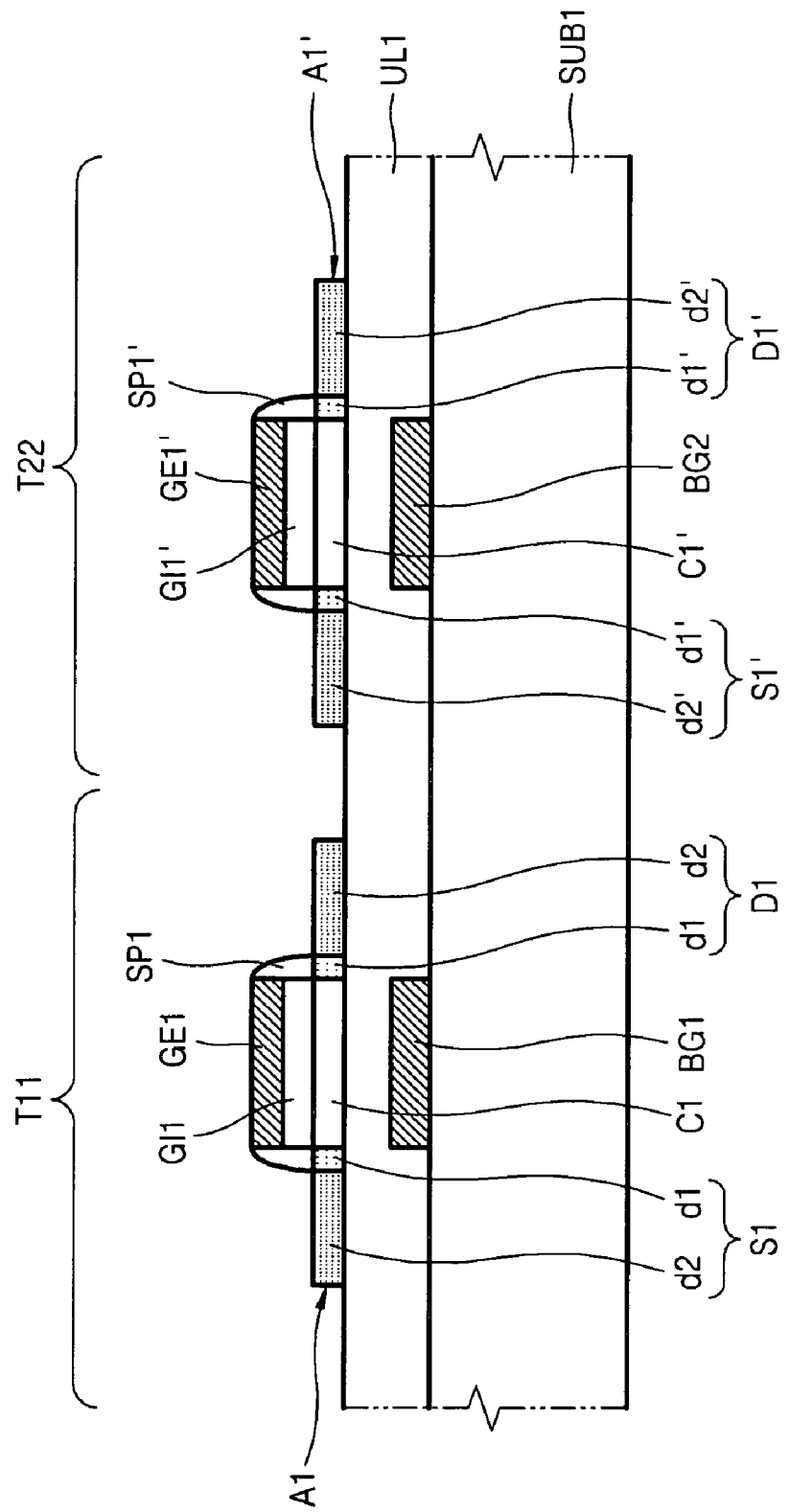

FIGS. 9 and 10 are cross-sectional views of semiconductor devices according to other example embodiments. Each of the semiconductor devices of FIGS. 9 and 10 includes the TFT of FIG. 8. For convenience of description, the first interlayer insulating layer ILD1, the first and second conductive plugs P1 and P2, the first and second electrodes E1 and E2, etc. of FIG. 8 are not illustrated in FIGS. 9 and 10.

Referring to FIG. 9, two TFTs (hereinafter, referred to as first and second TFTs) T11 and T2 are disposed on the substrate SUB1. The first TFT T11 may have a double gate structure that is the same or substantially the same as the TFT of FIG. 8. As discussed above, the TFT of FIG. 8 has a structure in which the first bottom gate electrode BG1 is added to the TFT of FIG. 1. The second TFT T2 may be formed on the lower insulating layer UL1, and may be a single gate structure. The second TFT T2 may be formed of the same or substantially the same material and may have the same or substantially the same structure as the TFT of FIG. 1. Specifically in the structure of FIG. 9 two TFTs, each of which is the TFT of FIG. 1, may be disposed, and one of the two TFTs (e.g., the first TFT T111) may be further include a first bottom gate electrode BG1. An active layer A1', a channel region C1', a conductive region d1', another conductive region d2', a source region S1', a drain region D1', a gate insulating layer GI1', a gate electrode GE1' and an insulating spacer SP1' of the second TFT T2 may correspond to the first active layer A1, the first channel region C1, the first conductive region d1, the second conductive region d2, the first source region S1, the first drain region D1, the first gate insulating layer GI1, the first gate electrode GE1 and the first insulating spacer SP1 of the first TFT T11, respectively. Thus, the first active layer A1 of the first TFT T11 and the active layer A1' of the second TFT T2 may be the same type (n or p) formed of the same or substantially the same material. The first active layer A1 and the active layer A1' may be formed on the same layer, for example, the lower insulating layer UL1. Thus, the portion of the first TFT T11 on the lower insulating layer UL1 and the second TFT T2 may be formed by using the same or substantially the same process. In addition, the first drain region D1 of the first TFT T11 and the source region S1' of the second TFT T2 may be formed in contact with (e.g., adjacent to) each other.

The modes of the first and second TFTs T11 and T2 may be the same or different. For example, one of the first and second TFTs T11 and T2 may be an enhancement mode, whereas the other one of the first and second TFTs T11 and T2 may be a depletion mode. If necessary, each of the first and second TFTs T11 and T2 may be an enhancement mode or a depletion mode transistor.

The first and second TFTs T11 and T2 may be electrically connected to constitute an inverter. In this example, one of the first and second TFTs T11 and T2 may be used as a load transistor of the inverter, and the other one of the first and second TFTs T11 and T2 may be used as a switching transistor of the inverter. Thus, according to at least some example embodiments, inverters of various modes such as an enhancement/depletion (E/D) mode, an enhancement/enhancement (E/E) mode, etc. may be embodied. A circular configuration of an inverter including two, electrically connected transistors is well known, and thus a detailed description is not given here. In addition, the inverter may be used as an elementary component or element device of logic circuits such as an NAND circuit, a NOR circuit, an encoder, a decoder, a multiplexer (MUX), a demultiplexer (DEMUX), a sense amplifier, etc. The basic configuration of the logic circuits is well known, and thus its detailed description is omitted. As the first and second TFTs T11 and T2 may constitute an inverter, the first type TFT Tr1 and the second type TFT Tr2 may also constitute an inverter. This may be applied to the semiconductor devices of FIGS. 10, 12 and 13.

The second TFT T2 of FIG. 9 may also have a double gate structure. Such an example is illustrated in FIG. 10.

Referring to FIG. 10, a second bottom gate electrode BG2 is disposed under the channel region C1' of the second transistor T22. Thus, each of the first and second TFTs T11 and T22 have a double gate structure. A semiconductor device of FIG. 10 may be the same or substantially the same as the semiconductor device shown in FIG. 9 except that the second bottom gate electrode BG2 is added. Due to such as double gate structure, a threshold voltage of the first and second TFTs T11 and T22 may be controlled more easily. Modes of the first and second TFTs T11 and T22 may be the same or different. The semiconductor device of FIG. 10 may be used to constitute an inverter, a logic circuit including an inverter, as well as other devices.

The semiconductor device of FIG. 10 may be manufactured by forming first and second bottom gate electrodes BG1 and BG2 on the substrate SUB1, forming a lower insulating layer UL1 covering the first and second bottom gate electrodes BG1 and BG2 and forming a top gate TFT (e.g., the TFT of FIG. 1) corresponding to each of the first and second bottom gate electrodes BG1 and BG2 on the lower insulating layer UL1. A method of manufacturing the top gate TFT (TFT of FIG. 1) may be the same or substantially the same as the method described with reference to FIGS. 3A through 3F or FIGS. 4A and 4B.

According to at least some example embodiments, a TFT may include a single layer type active layer (channel region). However, in another example embodiment, a TFT may have a multilayer type active layer (channel region), which will be described in more detail with regard to FIG. 11.

Figure 11:
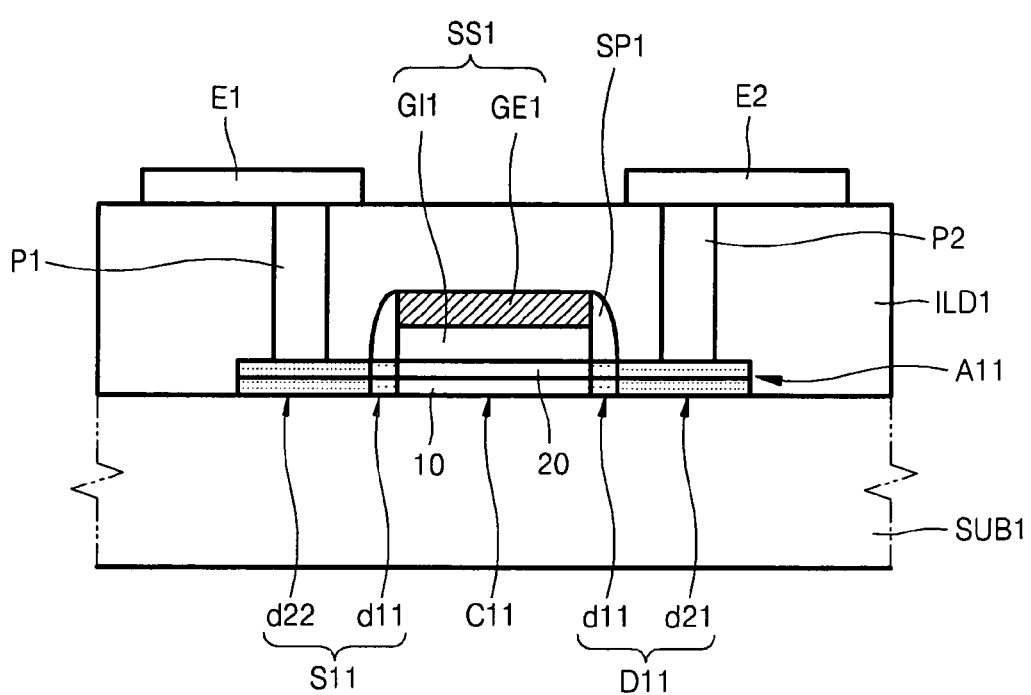
FIG. 11 is a cross-sectional view of a TFT according to another example embodiment.

FIG. 11 is a cross-sectional view of a TFT according to another example embodiment.

Referring to FIG. 11, a first active layer A11 has a multilayer structure. The multilayer structure may include at least two layers. The at least two layers may be different from each other. In the example embodiment shown in FIG. 11, the first active layer A11 has a double-layer structure including a first layer 10 and a second layer 20 disposed on the first layer 10. Portions of the first and second layers 10 and 20 may be plasma treated as described above to form a first source region S11 and a first drain region D11. The first source region S11 and the first drain region D11 may have a relatively high electrical conductivity. The portions of the first and second layers 10 and 20 forming the first source region S11 and the first drain region D11 may be plasma-treated using the same or substantially the same method as described above with respect to the first source region S1 and the first drain region D1 of FIG. 1. Thus, the first and second layers 10 and 20 of the first source region S11 and the first drain region D11 and the first and second layers 10 and 20 of the first channel region C11 may have different properties.

The first and second layers 10 and 20, which will be described later, denote the first and second layers 10 and 20 of the first channel region C11. The first layer 10 and the second layer 20 may have different mobilities. The second layer 20 may be closer to the first gate electrode GE1 as compared to the first layer 10, and may increase the mobility of the TFT. For example, when the second layer 20 is provided, the mobility of the TFT may increase compared to the case where the second layer 20 is not provided (e.g., the case where the first channel C11 is formed of only a material of the first layer 10). The first layer 10 is farther from the first gate electrode GE1 than the second layer 20.

A threshold voltage of the TFT may be better controlled by the first layer 10 than by the second layer 20. For example, when the thickness of the second layer 20 is fixed to an appropriate level, a threshold voltage of the TFT may be controlled according to material characteristics or properties (e.g., the material, composition, carrier concentration, etc.) of the first layer 10. When the first layer 10 is provided, a threshold voltage of the TFT may be moved in a positive (+) direction compared to the case where the first layer 10 is not provided (e.g., the case where the first channel region C11 is formed of only a material of the second layer 20). Thus, the TFT may be an enhancement TFT having relatively high mobility and a positive (+) threshold voltage. To achieve this, the first layer 10 may be a layer including, for example, a ZnO-based oxide. In this case, the first layer 10 may further include a group III element such as In, Ga, a combination thereof or the like. For example, the first layer 10 may be a gallium-indium-zinc-oxide (GIZO) layer. Alternatively, the first layer 10 may be a ZnO-based oxide layer doped with a group IV element such as Sn or other elements. The second layer 20 may include at least one of indium-zinc-oxide (IZO), indium-tin-oxide (ITO), aluminum-zinc-oxide (AZO), gallium zinc oxide (GZO), mixtures including at least one of the foregoing, or a material (e.g., oxide material) having greater electrical conductivity than that of the first layer 10.

The thickness of the second layer 20 may be about 10 Å to about 200 Å, inclusive. For example, the thickness of the second layer 20 may be about 30 Å to 100 Å, inclusive. When the second layer 20 is too thin, effects of increasing the mobility of the TFT due to the second layer 20 may be reduced. When the second layer 20 is too thick, a function of controlling a threshold voltage of the first layer 10 may deteriorate because it is more difficult to form a channel in the first layer 10. For example, when the second layer 20 is too thick, a threshold voltage of the TFT may be determined by the second layer 20 rather than by the first layer 10. Thus, the second layer 20 may be formed to a thickness of about 10 Å to 200 Å, inclusive. Alternatively, the second layer 20 may be formed to a thickness of about 30 Å to 100 Å, inclusive, in terms of a function of controlling a threshold voltage. However, the thickness may vary according to the size and kind of TFT. The first layer 10 may be formed to a thickness of about 10 Å to 2000 Å, inclusive, wherein the thickness may be the same, substantially the same or greater than that of the second layer 20. The TFT according to at least this example embodiment is not limited to an enhancement TFT. If necessary, the TFT may be a depletion mode TFT.

A plasma treating (or processing) with respect to the first active layer A11 having a double-layer structure may be the same or substantially the same as the plasma processing described above with reference to FIGS. 3A, 3D, 3E and 4A. The first source region S11 and the first drain region D11 may be formed by the plasma processing, and the first channel region C11 may be defined between the first source region S11 and the first drain region D11. Even if the second layer 20 includes one of IZO, ITO, AZO, GZO, a mixture including at least one of the foregoing, or other oxide, the effect generated by the plasma processing may be the same or substantially the same as the plasma processing in FIGS. 3A, 3D, 3E and 4A. The structure of FIG. 11 may be the same or substantially the same as that of FIG. 1 except for the first active layer A11. A manufacturing method of the TFT in FIG. 11 may also be the same or substantially the same as the case of FIG. 1 except for the first active layer A11.

Figure 12:
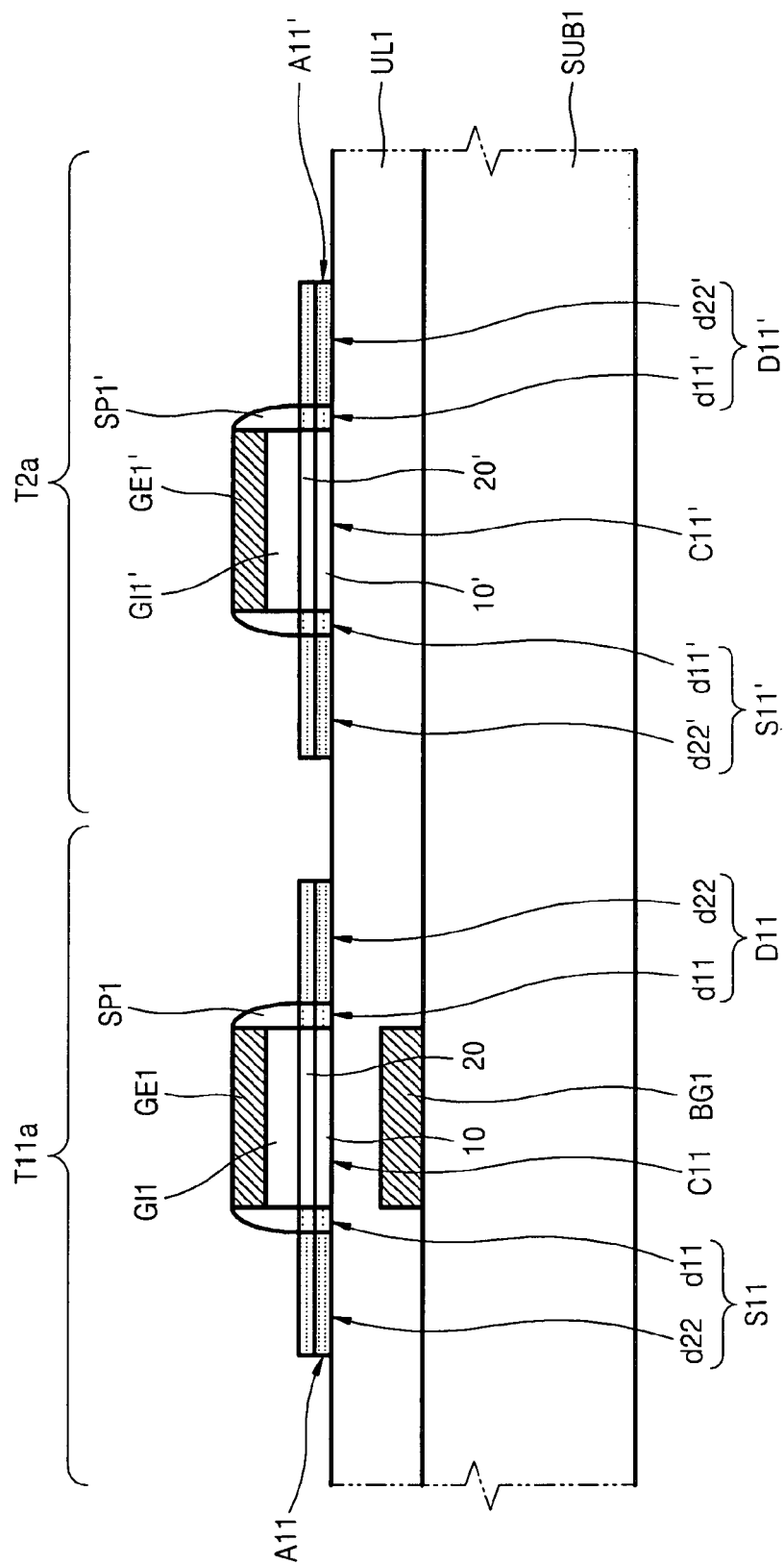
FIGS. 12 and 13 are cross-sectional views of a semiconductor device including TFTs according to example embodiments.
Figure 13:
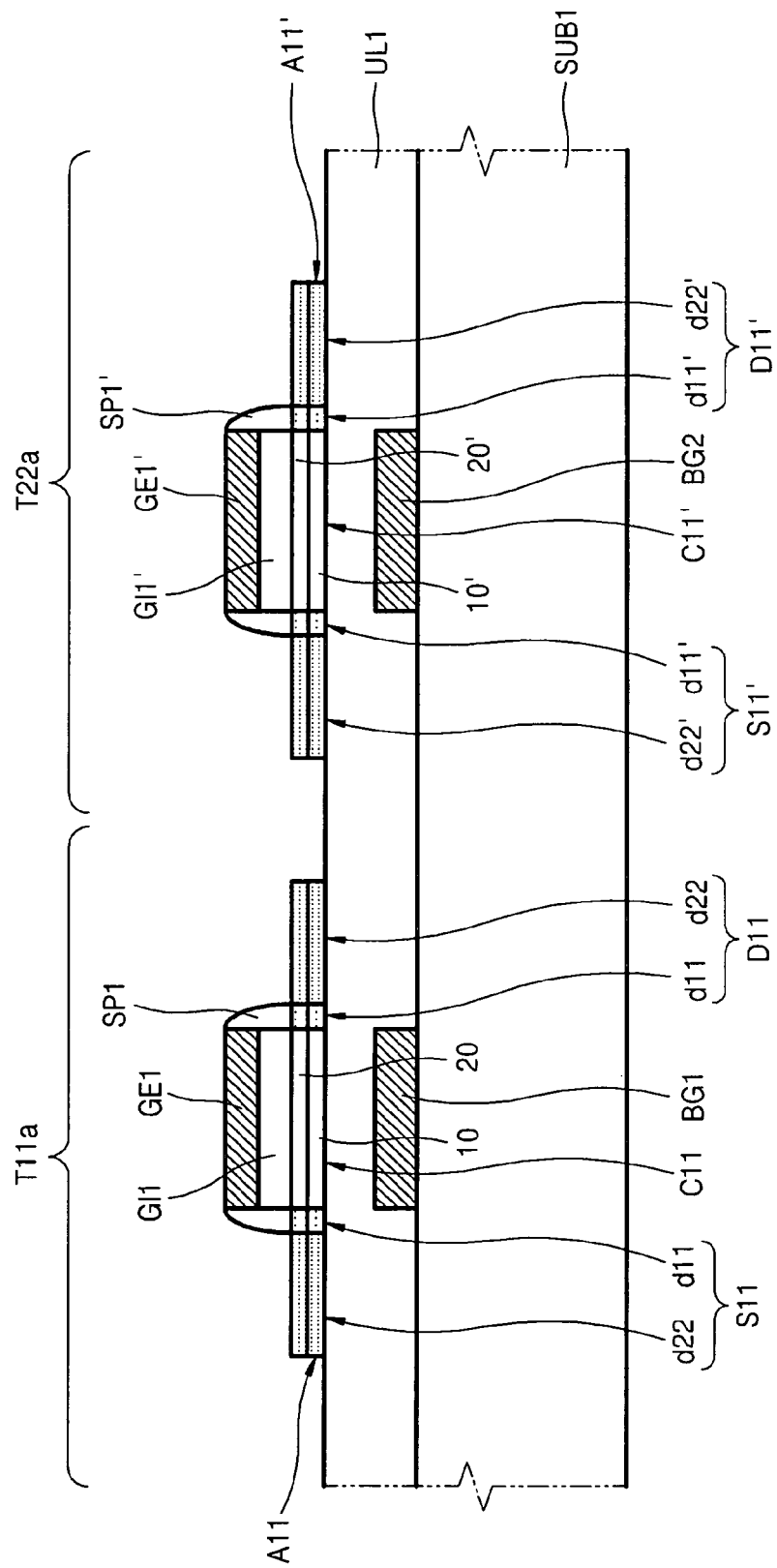

FIGS. 12 and 13 illustrate example embodiments in which two TFTs are disposed on the substrate SUB1. Each TFT may have the same structure of FIG. 11. A bottom gate electrode may be disposed below at least one of the two TFTs. For convenience of description, in FIGS. 12 and 13, the first interlayer insulating layer ILD1, the first and second conductive plugs P1 and P2, and the first and second electrodes E1 and E2, etc. of FIG. 11 are not illustrated.

Referring to FIG. 12, the first bottom gate electrode BG1 and the lower insulating layer UL1 covering the first bottom gate electrode BG1 may be disposed on the substrate SUB1. A top gate transistor having the same or substantially the same structure as the TFT in FIG. 11 may be disposed on a portion of the lower insulating layer UL1, which corresponds to the first bottom gate electrode BG1. The top gate transistor and the first bottom gate electrode BG1 may constitute a first TFT T1 a having a double gate structure. Another top gate transistor (e.g., a second TFT T2a having the same or substantially the same structure as the TFT of FIG. 11) may be disposed on another portion of the lower insulating layer UL1. An active layer A11', a channel region C11', a conductive region d11', another conductive region d22', a source region S11', a drain region D11', a gate insulating layer GI1' a gate electrode GE1' and an insulating spacer SP1' in the second TFT T2a may correspond to a first active layer A11, a first channel region C11, a conductive region d11, another conductive region d22, a first source region S11, a first drain region D11, a first gate insulating layer GI1, a first gate electrode GE1 and a first insulating spacer SP1 in the first TFT T11a, respectively. The structure of FIG. 12 may be the same or substantially the same as the structure of FIG. 9 except for the active layers A11 and A11'. Modes of the first and second TFTs T11a and T2a may be the same or different.

FIG. 13 illustrates an example embodiment in which the second TFT T2a of FIG. 12 has a double gate structure.

Referring to FIG. 13, the second bottom gate BG2 is disposed below the channel region C11' of the second TFT T22a. Thus, each of the first and second TFTs T11a and T22a has a double gate structure. The structure of FIG. 13 may be the same or substantially the same as the structure of FIG. 12 except for the second bottom gate BG2.

It should be understood that the example embodiments described therein should be considered in a descriptive sense only and not for purposes of limitation. Descriptions of features or aspects within each example embodiment should typically be considered as available for other similar features or aspects in other example embodiments. It will be obvious to those of ordinary skill in this art that, for example, the constituent elements of TFT and semiconductor device including the TFT may be varied and the structure of the TFT and semiconductor device including the TFT may also be modified. In addition, the TFT may be applied to fields of a memory device and logic device as well as a liquid crystal display device (LCD) such as an active matrix LCD (AM-LCD) and an organic light emitting display device (OLED) such as an active matrix OLED (AMOLED). Therefore, the scope of the general inventive concept is defined not by the detailed description, but by the appended claims.

What is claimed is:

1. A transistor comprising:
a source, a drain, and a channel region between the source and the drain, wherein the source, the drain and the channel region are formed from a same oxide semiconductor layer formed on a substrate;
a stack structure including a gate insulating layer and a gate electrode, which are stacked on the channel region; and
an insulating spacer formed at each side wall of the stack structure, wherein
each of the source and the drain includes at least two regions having different conductivities,
a first of the at least two regions is adjacent to the channel region and has a smaller conductivity than a second of the at least two regions, and
each of the first regions is arranged below a corresponding insulating spacer.

2. The transistor of claim 1, wherein the source and the drain are plasma-treated.

3. The transistor of claim 1, further comprising:
a bottom gate electrode disposed below the channel region.

4. The transistor of claim 1, wherein the oxide semiconductor layer has a multi-layer structure including at least two layers stacked sequentially.

5. The transistor of claim 4, wherein a first of the at least two layers is a ZnO-based oxide layer.

6. The transistor of claim 4, wherein a second of the at least two layers includes,
at least one of IZO, ITO, AZO, GZO, a combination thereof, or an oxide having an electrical conductivity greater than that of the first of the at least two layers.

7. A semiconductor device comprising:
a first transistor including,
a first source, a first drain, and a first channel region between the first source and the first drain, wherein the first source, the first drain and the first channel region are formed from a same first oxide semiconductor layer formed on a substrate, and
a first stack structure including a first gate insulating layer and a first gate electrode, which are stacked on the first channel region; and
a second transistor including,
a second oxide semiconductor layer having a second source, a second drain, and a second channel region between the second source and the second drain, and
a second stack structure including a second gate insulating layer and a second gate electrode, which are stacked on the second channel region, wherein
at least one of the first oxide semiconductor layer and the second oxide semiconductor layer has a multi-layer structure including at least two layers stacked sequentially.

8. The semiconductor device of claim 7, wherein the second oxide semiconductor layer has a type that is the same as or different from the first oxide semiconductor layer.

9. The semiconductor device of claim 8, wherein when the second oxide semiconductor layer is a different type from the first oxide semiconductor layer, an insulating layer is arranged between the substrate and the second transistor, and the first and second oxide semiconductor layers are arranged on different layers.

10. The semiconductor device of claim 7, further comprising:
a bottom gate electrode arranged below at least one of the first channel region and the second channel region.

11. The semiconductor device of claim 7, wherein a first of the at least two layers is a ZnO-based oxide layer.

12. The semiconductor device of claim 7, wherein a second of the at least two layers includes at least one of IZO, ITO, AZO, GZO, a combination thereof, or an oxide having greater electrical conductivity than that of the first of the at least two layers.

13. The semiconductor device of claim 7, wherein the first source, the first drain, the second source and the second drain are plasma-treated.

14. A transistor comprising:
a source and a drain formed of an oxide semiconductor on a substrate;
a channel region formed on the substrate between the source and the drain, the channel region being formed of the oxide semiconductor; and
a stack structure including a gate insulating layer and a gate electrode stacked on the channel region; wherein the source and drain do not overlap the gate electrode, and
a surface portion of each of the source and drain has a higher concentration of indium than other portions of the source and drain.

15. The transistor of claim 14, wherein each of the source and drain have a plasma-treated surface region.

16. A transistor comprising:
a source and a drain formed on a substrate, each of the source and drain being formed of an oxide semiconductor and having a surface portion with a higher concentration of indium than other portions of the source and drain;
a channel region formed on the substrate between the source and the drain; and
a stack structure formed on the channel region, the stack structure including a gate insulating layer and a gate electrode stacked sequentially.

17. The transistor of claim 16, wherein the surface portions of the source and drain are plasma-treated.

18. The transistor of claim 17, wherein the channel region is formed of an oxide semiconductor.

19. The transistor of claim 18, wherein each of the source and drain are plasma-treated.

20. A transistor comprising:
a source region and a drain region formed on a substrate, each of the source and drain regions being formed of an oxide semiconductor and having a plasma-treated surface region, wherein the plasma-treated surface region of the source and the drain regions has a higher conductivity than other portions of the source and drain regions;
a channel region formed on the substrate between the source region and the drain region; and
a stack structure including a gate insulating layer and a gate electrode stacked on the channel region, wherein
a surface portion of each of the source and drain regions has a higher concentration of indium than other portions of the source and drain regions.

21. The transistor of claim 20, wherein the source and drain regions do not overlap the gate electrode.

22. A method of manufacturing a transistor comprising:
forming an oxide semiconductor layer on a region of a substrate;
forming a stack structure including a gate insulating layer and a gate electrode, which are stacked on the oxide semiconductor layer;
forming a source region and a drain region in portions of the oxide semiconductor layer, which are disposed on both sides of the stack structure, wherein the forming of the source region and the drain region includes,
first plasma-treating portions of the oxide semiconductor layer at each side of the stack structure to form conductive regions at each side of the stack structure,
forming insulating spacers at each side wall of the stack structure, and
second plasma-treating the oxide semiconductor layer at each side of the stack structure and the insulating spacers.

23. The method of claim 22, further comprising:
forming a bottom gate electrode on the substrate; and
forming a lower insulating layer covering the bottom gate electrode; wherein
the oxide semiconductor layer is formed on the lower insulating layer formed on the bottom gate electrode.

24. The method of claim 22, wherein the oxide semiconductor layer is formed as a multi-layer structure including at least two layers stacked sequentially.

25. The method of claim 24, wherein a first of the at least two layers is a ZnO-based oxide.

26. The method of claim 24, wherein a second of the at least two layers includes at least one of IZO, ITO, AZO, GZO, a combination thereof, or an oxide having greater electrical conductivity than that of the first of the at least two layers.

27. A method of manufacturing a semiconductor device including at least two transistors, the method comprising:
forming a first transistor which includes,
forming a first oxide semiconductor layer on a first region of a substrate,
forming a first stack structure including a first gate insulating layer and a first gate electrode, which are stacked on the first oxide semiconductor layer, and
forming a first source and a first drain from portions of the first oxide semiconductor layer, which are disposed on both sides of the first stack structure; and
forming a second transistor which includes,
forming a second oxide semiconductor layer on a second region of the substrate,
forming a second stack structure including a second gate insulating layer and a second gate electrode, which are stacked on the second oxide semiconductor layer, and
forming a second source and a second drain from portions of the second oxide semiconductor layer, which are disposed on both sides of the second stack structure, wherein
the at least one of the first and second oxide semiconductor layers are formed as a multi-layer structure including at least two layers.

28. A method of manufacturing a semiconductor device including at least two transistors, the method comprising:
forming a first transistor which includes,
forming a first oxide semiconductor layer on a first region of a substrate,
forming a first stack structure including a first gate insulating layer and a first gate electrode, which are stacked on the first oxide semiconductor layer, and
forming a first source region and a first drain region in portions of the first oxide semiconductor layer, which are disposed on both sides of the first stack structure; and
forming a second transistor which includes,
forming a second oxide semiconductor layer on a second region of the substrate,
forming a second stack structure including a second gate insulating layer and a second gate electrode, which are stacked on the second oxide semiconductor layer, and
forming a second source region and a second drain region in portions of the second oxide semiconductor layer, which are disposed on both sides of the second stack structure;
wherein the first and second oxide semiconductor layers are different types, and the forming of the first stack structure includes,
forming a first gate insulating material layer covering the first oxide semiconductor layer,
forming an etch-stop layer on the first gate insulating material layer,
forming the second oxide semiconductor layer on the etch-stop layer of the second region of the substrate,
forming a second gate insulating material layer covering the second oxide semiconductor layer on the etch-stop layer, sequentially removing the second gate insulating material layer and the etch-stop layer from the first region,
forming a first gate electrode material layer on the first gate insulating material layer, and
patterning the first gate electrode material layer and the first gate insulating material layer, wherein
the first gate electrode material layer is formed on the first gate insulating material layer of the first region and the second gate insulating material layer of the second region, and
the first gate electrode material layer and the second gate insulating material layer of the second region are patterned to form the second stack structure on the second oxide semiconductor layer.

29. The method of claim 27, wherein the first and second oxide semiconductor layers are the same type, and the first and second oxide semiconductor layers are formed on the same layer.

30. The method of claim 27, further comprising:
forming a bottom gate electrode below at least one of the first and second oxide semiconductor layers.

* * * * *